United States Patent [19]
Matsuo

[11] Patent Number: 5,856,216
[45] Date of Patent: Jan. 5, 1999

[54] METHOD OF MANUFACTURING A SEMICONDUCTOR INTEGRATED CIRCUIT DEVICE INCLUDING AN SRAM

[75] Inventor: Ryuichi Matsuo, Hyogo, Japan

[73] Assignee: Mitsubishi Denki Kabushiki Kaisha, Tokyo, Japan

[21] Appl. No.: 755,726

[22] Filed: Nov. 25, 1996

Related U.S. Application Data

[62] Division of Ser. No. 383,124, Feb. 3, 1995, Pat. No. 5,598,020.

[30] Foreign Application Priority Data

Feb. 28, 1994 [JP] Japan ........................... 6-30160

[51] Int. Cl.⁶ .................................................. H01L 21/8244
[52] U.S. Cl. ........................... 438/238; 438/277; 438/279
[58] Field of Search ....................... 438/238, 277, 438/279, 283, 384, 385, 588, 655, 657

[56] References Cited

U.S. PATENT DOCUMENTS

| | | | |
|---|---|---|---|
| 4,380,863 | 4/1983 | Rao | 438/279 |
| 4,409,722 | 10/1983 | Dockerty et al. | 438/283 |
| 4,968,645 | 11/1990 | Baldi et al. | 438/384 |
| 5,198,691 | 3/1993 | Tarng | 257/316 |
| 5,319,245 | 6/1994 | Chen et al. | 257/751 |
| 5,373,192 | 12/1994 | Eguchi | 257/774 |

OTHER PUBLICATIONS

"A High Density SRAM Cell Using Poly–si PMOS FET," Yamanaka et al., ICD89–26, pp. 1–6. No date.

"A 7.5–NS 32K x 8 CMOS SRAM," Hiroaki Okuyama et al., IEEE Journal of Solid–State Circuits, vol. 23, No. a5, Oct. 1988, pp. 1054–1058.

*Primary Examiner*—Chandra Chaudhari
*Attorney, Agent, or Firm*—McDermott, Will & Emery

[57] ABSTRACT

A semiconductor integrated circuit device includes a first conductor formed on a main surface of a semiconductor substrate with an insulating film therebetween, and a second conductor formed with an insulating film therebetween so as to be placed near one side of the first conductor and to have its one end extended over a top surface of the one side of the first conductor. The semiconductor integrated circuit device further includes an impurity diffusion layer at the main surface of the semiconductor substrate under a region where first and second conductors are close to each other. In accordance with this structure, higher degree of integration of a memory cell can be readily achieved by a relatively simple manufacturing process. Such a structure can be manufactured by forming the impurity diffusion layer at the surface of the semiconductor substrate, forming first conductor by patterning a first conductor layer, forming a second conductor layer, and forming a second conductor by patterning the second conductor layer.

4 Claims, 29 Drawing Sheets

METHOD OF MANUFACTURING A SEMICONDUCTOR INTEGRATED CIRCUIT DEVICE INCLUDING AN SRAM

This application is a division of application Ser. No. 08/383,124 now U.S. Pat. No. 5,598,020 filed Feb. 3, 1995.

BACKGROUND OF THE INVENTION

1. Field of the Invention

The present invention relates to a structure of a semiconductor integrated circuit device and manufacturing method thereof, and more particularly, to a structure of a semiconductor integrated circuit device including an SRAM (Static Random Access Memory) and manufacturing method thereof.

2. Description of the Background Art

An SRAM has been known as a static-type semiconductor memory device. The most preferable effect of the present invention can be obtained when it is applied to the SRAM, and therefore, a conventional SRAM will now be described with reference to the figures.

Referring to FIGS. 25A to 25C, in a single memory cell, two driver transistors (n-channel MOS transistors) Q3 and Q4 with their gate electrodes and drain electrodes cross-coupled to each other, and two load transistors (p-channel MOS transistors) Q5 and Q6 connected to the drain electrodes of the driver transistors Q3 and Q4, respectively, constitute a flip-flop type memory cell. The drain electrodes of these two driver transistors Q3 and Q4 are connected to two access transistors (n-channel MOS transistors) Q1 and Q2, respectively. Gate electrodes of these access transistors Q1 and Q2 are connected to a word line WL. When this word line WL is selected, information held in driver transistors Q3 and Q4 is transferred to bit lines BLa and BLb through access transistors Q1 and Q2, respectively. One memory cell node N1 is connected to the drain electrode of driver transistor Q3, the gate electrode of driver transistor Q4, a drain electrode of load transistor Q5, and a gate electrode of load transistor Q6. The other memory cell node N2 is connected to the gate electrode of driver transistor Q3, the drain electrode of driver transistor Q4, a gate electrode of load transistor Q5, and a drain electrode of load transistor Q6. Source electrodes of driver transistors Q3 and Q4 are connected to a ground potential GND. Source electrodes of load transistors Q5 and Q6 are connected to a power supply potential Vcc.

A flip-flop circuit having to stable states is formed of driver transistors Q3 and Q4 with their drain electrodes and gate electrodes cross-connected to each other. Thus, bit information (data) can be recorded. More specifically, 1-bit information can be stored if potentials of one memory cell node N1 and the other N2 are held at a "High" level and a "Low" level or at "Low" and "High", respectively. When a desired memory cell is selected, that is, word line WL is at a "High" level, access transistors Q1 and Q2 are turned on. Thus, memory cell nodes N1 and N2 are rendered conductive with bit lines BLa and BLb, respectively. At this time, voltages corresponding to the states of driver transistors Q3 and Q4 appear at bit lines BLa and BLb through access transistors Q1 and Q2, respectively. Thus, information held in the memory cell is read out. When data is to be written into the memory cell, voltages corresponding to desired states to be written are applied to bit lines BLa and BLb, respectively, with access transistors Q1 and Q2 turned on. In order to maintain a data-stored state latched by the flip-flop circuit which is constituted by driver transistors Q3 and Q4, current is supplied from power supply potential Vcc through load transistors Q5 and Q6.

As described above, a memory cell of a CMOS type SRAM is constituted by six transistors Q1-Q6. Thus, as shown in FIG. 25B, a region where four n-channel MOS transistors are formed and a region where two p-channel MOS transistors are formed are required to form a single memory cell. In addition, as shown in FIG. 25C, a p-type well region and an n-type well region are required to form the n-channel MOS transistors and the p-channel MOS transistors in a semiconductor substrate. Thus, area which is required for the CMOS type SRAM memory cell is large so long as a bulk-type MOS transistor (an MOS transistor formed on a surface of a semiconductor substrate) is used. Accordingly, the CMOS type SRAM memory cell which is constituted by the bulk-type MOS transistor is not suitable for improving degree of integration.

A structure of an SRAM memory cell which solves the above-described problems and allows higher degree of integration includes a high resistance load type memory cell.

Referring to FIG. 26A, in a single memory cell, two driver transistors (n-channel MOS transistors) Q3 and Q4 having their gate electrodes and drain electrodes cross-coupled to each other, and two high resistance loads HR1 and HR2 connected to respective drain electrodes of the driver transistors constitute a flip-flop type memory cell. Two access transistors (n-channel MOS transistors) Q1 and Q2 are connected to the drain electrodes of these two driver transistors Q3 and Q4, respectively. Gate electrodes of these access transistors Q1 and Q2 are connected to a word line WL. When this word line WL is selected, information held in driver transistors Q3 and Q4 is transferred to bit lines BLa and BLb through access transistors Q1 and Q2, respectively. One memory cell node N1 is connected to the drain electrode of driver transistors Q3 and the gate electrode of driver transistor Q4. The other memory cell node N2 is connected to the gate electrode of driver transistor Q3 and the drain electrode of driver transistor Q4. The source electrodes of driver transistors Q3 and Q4 are connected to a ground potential GND. In addition, drain electrodes of driver transistors Q3 and Q4 are connected to a power supply potential Vcc through high resistance loads HR1 and HR2, respectively.

As in the case of the CMOS-type memory cell, in the high resistance load type memory cell with the above-described arrangement, a flip-flop circuit is formed with drain electrodes and gate electrodes of driver transistors Q3 and Q4 cross-connected to each other. Thus, bit information (data) can be stored. Read/write operation of data in the high resistance load-type memory cell is the same as that in the above-described CMOS-type memory cell. The high resistance load-type memory cell is different from the CMOS-type memory cell in that current is supplied from power supply potential Vcc through high resistance loads HR1 and HR2 in order to maintain a data-stored state latched by the flip-flop circuit which is constituted by driver transistors Q3 and Q4.

As described above, the high resistance load-type memory cell is constituted by four transistors Q1–Q4 and two high resistance loads HR1 and HR2. As shown in FIG. 26B, first, a region where four n-channel MOS transistors are formed is required to form a single high resistance load-type memory cell. High resistance loads HR are formed on two n-channel MOS transistors which constitute driver transistors Q3 and Q4. As shown in FIG. 26C, only a p-type well region is required in order to provide a high resistance load-type memory cell. Thus, area required for the memory cell is smaller than that for the CMOS-type memory cell in which both p-type well and n-type well must be formed in a memory cell. Accordingly, the high resistance load-type memory cell is advantageous in improving degree of integration of SRAM.

Meanwhile, in the high resistance load-type memory cell, current is supplied from power supply potential Vcc through high resistance loads HR1 and HR2 in order to maintain a data-stored state latched by the flip-flop circuit which is constituted by driver transistors Q3 and Q4. This current is desired to be small to suppress power consumption during standby. Therefore, electric resistance of the high resistance load must be made as large as possible. However, increase in resistance of the resistance load is limited, and current flowing through the high resistance load is required to be larger than leak current at the time when the transistor is off in order to maintain the data. On the other hand, in the CMOS-type memory cell, current is supplied from power supply potential Vcc through load transistors (p-channel MOS transistors) Q5 and Q6 in order to maintain a storage state of data latched by the flip-flop circuit. Accordingly, current consumption during standby can be reduced to a level of junction leak current. As has been described above, the high resistance load-type memory cell is advantageous in improving degree of integration of the SRAM, while the CMOS-type memory cell is advantageous in reducing current consumption for holding a storage state of data, that is, in suppressing power consumption during standby.

In view of the above description, such a structure as shown in FIGS. 27A and 27B of the CMOS-type memory cell which allows improvement in degree of integration of the SRAM has been proposed.

Referring to FIG. 25A, FIGS. 27A and 27B, a p-channel thin film transistor (TFT) instead of a bulk-type p-channel MOS transistor is used as load transistors Q5 and Q6. Therefore, as shown in FIG. 27A, a region where four n-channel MOS transistors are formed is required in order to form a single memory cell. The p-channel TFTs which constitute load transistors Q5 and Q6 are formed on the n-channel MOS transistors which constitute driver transistors Q3 and Q4. As shown in FIG. 27B, four bulk-type n-channel MOS transistors are formed in a p-type well region. Thus, when the p-channel TFT is used as a load transistor, only a p-type well region is required in order to form a single memory cell. Therefore, by using the p-channel TFT, area which is required for the CMOS-type memory cell can be reduced and a structure of the CMOS-type memory cell which is advantageous in improving degree of integration is provided.

A CMOS-type SRAM memory cell in which a p-channel TFT formed of a polysilicon layer is used as a load transistor such as shown in FIGS. 28 and 29 is disclosed, for example, in "ICD89-26", pp. 1–6.

Referring to FIGS. 28 and 29, an n-type well region 502 and a p-type well region 503 are formed on a p-type silicon substrate 501 in this order. An $n^+$ impurity region 209 of an n-channel MOS transistor which constitutes a driver transistor or an access transistor is formed at p-type well region 503. An isolation oxide film 200 is formed to isolate the n-channel MOS transistors from each other. Gate electrodes 201 and 202 made of a first polysilicon layer is formed on p-type well region 503 with a gate insulating film 210 therebetween. These gate electrodes 201 and 202 form a gate of the access transistor or the driver transistor. A gate electrode 204 made of a second polysilicon layer is formed on gate electrodes 201 and 202 with an insulating film therebetween. Gate electrode 204 forms a gate of the p-channel TFT used as load transistors Q5 and Q6. A source region 206a, a channel region 206, and a drain region 206b of the TFT, which are made of third polysilicon layer, are formed on gate electrode 204 with a gate insulating film 212 therebetween. Source region 206a of the TFT forms a power supply interconnection Vcc. Drain region 206b of one TFT is connected to gate electrode 204 of the other TFT through a contact hole 205. An interlayer insulating film 214 is formed to cover each transistor. A refractory metal layer 207a is formed so as to be in contact with $n^+$ impurity region 209 through a contact hole 208. An interlayer insulating film 216 is formed on refractory metal layer 207a. An aluminum metal layer 207b is connected to refractory metal layer 207a. A bit line is formed of aluminum metal layer 207b.

The present invention can be applied to manufacturing of any one of the above-described types of SRAMs, and in particular, it can be applied effectively to a high resistance load-type SRAM. Accordingly, application to the high resistance load-type SRAM will be mainly described in the following embodiments. A specific structure of the above-described conventional high resistance load-type SRAM will now be described somewhat in detail with reference to FIGS. 30–32. The conventional high resistance load-type SRAM with an equivalent circuit shown in FIG. 26A has such an arrangement as shown in FIG. 30 when it is viewed two-dimensionally. FIGS. 31 and 32 are cross sections taken along the lines X—X and Y—Y in FIG. 30, respectively.

Referring to FIG. 31, in this conventional high resistance load-type SRAM, a gate electrode 3 made of a first polycrystalline silicon layer is provided on a channel region sandwiched between n-type impurity diffusion layers 6 and 7 which constitute a drain region and a source region of driver transistor Q3 and which are formed at a surface of a semiconductor substrate 1, with a gate insulating film 2 therebetween. A gate electrode 5 made of the first polycrystalline silicon layer is also provided on a channel region sandwiched between n-type impurity diffusion layers 6 and 7 of driver transistor Q4 with gate insulating film 2 therebetween. High resistance loads 9 and 9 which are made of a second polycrystalline layer and constitute high resistance loads HR1 and HR2 are formed above gate electrodes 3 and 5, respectively. A pair of bit lines 10 and 10 are formed on high resistance loads 9 and 9 with an interlayer insulating film 8 therebetween.

Referring to FIG. 32, an access transistor Q1 is provided with a gate electrode 11 made of the first polycrystalline silicon layer on a channel region sandwiched between n-type impurity diffusion layers 7 and 7 which constitute a source region and a drain region of access transistor Q1, with a gate insulting film therebetween. Bit line 10 is electrically connected to one n-type impurity diffusion layer 7 at a contact 14 through a contact hole 14a which is formed in interlayer insulating film 8. First gate electrode 3 and one high resistance load 9 are joined to each other on a region of the other n-type impurity diffusion layer 7 of access transistor Q1, and high resistance load 9 is electrically connected to n-type impurity diffusion layer 7 at a contact 13 (see FIG. 30).

The pair of high resistance loads 9 and 9 are formed so as to have high resistance not across their entire length, but at a prescribed region thereof.

Gate electrode 5 of driver transistor Q4 and impurity diffusion layer 7 which forms the drain region of driver transistor Q3 are electrically connected to each other at a contact hole 17. A pair of bit lines 10 and 10 are formed by patterning a first aluminum interconnection layer.

In the above-described conventional high resistance load-type SRAM memory cell, a single memory is constituted by six elements including four MOS-type transistors and two high resistance loads. Although area required for the memory cell has been reduced by placing a high resistance load above a driver transistor, prescribed spaces are necessary to isolate n-type impurity diffusion layers which constitute source and drain regions of each transistor from each other and to isolate three gate electrodes which has been formed by patterning a first polysilicon layer from each other, and therefore, it has been very difficult to reduce area required for the memory cell. Accordingly, implementation of a high resistance load-type SRAM which solves such a problem and has desired degree of integration requires more complex manufacturing process, which leads to increase in manufacturing cost.

Such conventional problems of the SRAM as described above relate not only to the high resistance load-type SRAM but also to a TFT-type SRAM in which a thin film transistor (TFT) instead of a high-resistance load is used as a load element, since a basic structure of the TFT-type SRAM is the same as that of the high resistance load-type SRAM.

In addition, although description of a structure which includes two polycrystalline silicon layers and one aluminum interconnection layer has been given in the conventional example above, a recently-disclosed structure including three or four polycrystalline silicon layers and two aluminum interconnection layers has similar problems since the basic structure thereof is the same as that of the conventional example.

SUMMARY OF THE INVENTION

It is an object of the present invention to provide a structure of a semiconductor integrate circuit device in which improvement in degree of integration of a memory cell can be readily achieved by a relatively simple manufacturing process, and manufacturing process thereof.

A semiconductor integrated circuit device which solves the above-described problems in accordance with a first aspect of the present invention includes a first conductor of prescribed width and thickness formed on a main surface of a semiconductor substrate with an insulating film therebetween; and a second conductor formed on the main surface of the semiconductor substrate with a gate insulating film therebetween, placed near one side surface of the first conductor, and having its one end extended over a top surface near the one side surface of the first conductor with an insulating film interposed. It further includes, at the main surface of the semiconductor substrate, an impurity diffusion layer under a region where the first and second conductors are close to each other.

This semiconductor integrated circuit device has a structure in which a second polycrystalline silicon layer is formed so as to have its one end extended over a top surface at one end portion of the first conductor, and therefore, it can be manufactured through the steps of forming the first conductor by patterning, covering a surface thereof with the insulating film, and forming the second polycrystalline silicon layer by patterning on the semiconductor substrate 1 including the insulating film. Accordingly, structure in which the first and second conductors are formed so as to be adjacent to each other with a space therebetween smaller than the smallest possible space formed by patterning, can be implemented, resulting in an integrated circuit device in which improvement in degree of integration can be achieved.

In a preferred embodiment of this semiconductor integrated circuit device, the first and second conductors are formed of impurity-doped polycrystalline silicon layer, and a conductive metal thin film is applied to a prescribed region of a top surface of at least one of the impurity diffusion layer, and first and second conductors.

Since the conductive metal thin film is applied to the surface of the impurity diffusion layer in this semiconductor integrated circuit device, resistance of a conductive interconnection formed of the impurity diffusion layer can be reduced, and contact resistance can be suppressed when the conductive interconnection is electrically connected to another conductive interconnection layer at the surface of the impurity diffusion layer, resulting in a semiconductor integrated circuit device with superior property.

Another aspect of the present invention relates to a semiconductor integrated circuit device including a static-type semiconductor memory device, which is provided with first and second driver transistors which is connected to a pair of load elements and forms a flip-flop circuit with the pair of load elements, and is further provided with a pair of access transistors connected to those driver transistors. The first driver transistor includes a first gate electrode of prescribed width and thickness formed on a main surface of a semiconductor substrate with a gate insulating film therebetween, and first source and drain regions formed at the surface of the semiconductor substrate to sandwich a channel region under the first gate electrode therebetween. The second driver transistor includes a second gate electrode of prescribed width and thickness formed adjacent to the first gate electrode on the side of the source region of the first gate electrode with an insulating film therebetween, and second source and drain regions formed at the main surface of the semiconductor substrate to sandwich a channel region under the second gate electrode therebetween. The second gate electrode has its one end on the side of the second source region extended over an end portion of the first gate electrode on the side of the source region thereof with an insulating film therebetween, and thus a portion of the second gate electrode overlaps the first gate electrode when it is viewed two-dimensionally. First and second source regions are formed of a common impurity diffusion layer formed at the main surface of the semiconductor substrate under a region where first and second gate electrodes are close to each other.

In accordance with this semiconductor integrated circuit device, area required for a pair of driver transistors can be reduced by applying the structure in accordance with the above-described first aspect of the present invention to each gate electrode of first and second driver transistors, resulting in improvement in degree of integration of a semiconductor integrated circuit device including the SRAM.

In a preferred embodiment of this semiconductor integrated circuit device, it has, in addition to the above-described structure, a structure in which a conductive metal thin film is applied to a prescribed region of a top surface of at least one of the common impurity diffusion layer, first and second drain regions, and first and second gate electrodes.

In accordance with the semiconductor integrated circuit device with this structure, resistance of an impurity diffusion layer as a conductive interconnection can be reduced, for example, by applying a conductive metal thin film to a surface of the impurity diffusion layer which forms a common source region of a pair of driver transistors.

In addition, contact resistance of a bit line and a drain region can be suppressed by applying a conductive metal thin film to a surface of the impurity diffusion layer, which forms drain regions of a pair of driver transistors, and thereby connecting this region to a bit line.

In another preferred embodiment of the semiconductor integrated circuit device, a pair of word lines and a pair of bit lines are connected to each of a pair of access transistors, the pair of word lines are arranged parallel to each other in the direction perpendicular to the direction of a channel length of the first driver transistor, and the pair of bit lines are arranged parallel to each other in the direction parallel to the direction of a channel length of the first driver transistor.

In accordance with this structure, a conductive interconnection for supplying Vcc, which is usually formed in the direction perpendicular to the direction of the channel length of the driver transistor, can be formed parallel to the pair of bit lines. Accordingly, the conductive interconnection for supplying Vcc can be formed by patterning the same aluminum layer as that used for the pair of bit lines.

A method of manufacturing a semiconductor integrated circuit device in accordance with the present invention includes the following steps.

First, an impurity diffusion layer of a second conductivity type is formed at a prescribed region of a main surface of a semiconductor substrate of a first conductivity type by implanting an impurity of a second conductivity type. Then, a first conductive layer of a prescribed thickness is formed on the main surface of the semiconductor substrate with a first insulating film therebetween, and a first conductor of a prescribed width is formed by patterning the first conductive layer. After top and side surfaces of the first conductor are covered with a second insulating film, a second conductor layer of a prescribed thickness is formed on the first and second insulating films. Then, the second conductor layer is patterned, and a second conductor is formed with its one side on the top surface of the first conductor and the other side on the region of the first insulating film where the first conductor is not formed.

In accordance with this manufacturing method, first, the impurity diffusion layer of the first conductivity type is formed and the first conductor is formed, then, the second conductor layer is formed with the second insulating film therebetween and the second conductor is formed by patterning the second conductor layer. Therefore, space between the first and second conductor layers which are adjacent to each other can be set as a thickness of the second insulating film. Consequently, two conductors which are close to each other can be formed with the space therebetween smaller than the smallest possible formed by patterning while superior insulation property is still maintained, with respect to the case in which two conductors are formed by patterning the same conductor layer.

A preferred embodiment of this manufacturing method further includes, after the step of forming the impurity diffusion layer, the steps of exposing a surface of the impurity diffusion layer using the same mask as that is used in the formation of the impurity diffusion layer, and forming a conductive metal thin film on the exposed surface of the impurity diffusion layer.

In accordance with this manufacturing method, the conductive metal thin film is formed on the surface of the impurity diffusion layer using the same mask as that used in the formation of the impurity diffusion layer. Therefore, another mask for formation of the conductive metal thin film need not be formed.

Another preferred embodiment of this manufacturing method further includes, after the step of forming the second conductor, the step of forming the conductive metal thin film on a prescribed region of the surface of the first and second conductors.

Since this manufacturing method includes the step of forming the conductive metal thin film on a prescribed region of the surface of the first and second conductors, reduction in resistance of the first and second conductors as a conductive interconnection and reduction in contact resistance at the time of connection to another conductive interconnection can be achieved.

In a further preferred embodiment of the manufacturing method, the first and second conductors are formed of impurity-doped polycrystalline silicon, and the step of forming the conductive metal thin film includes the steps of heating after formation of a metal thin film on the whole surface of the semiconductor substrate to cause salicide reaction between the metal thin film and the first and second conductors, removing the metal thin film which has not reacted, and forming a metal salicide film on the surface of the first and second conductors.

In accordance with this manufacturing method, a conductive metal thin film according to claim 8 is formed in a self-aligned manner by using salicide reaction of the metal thin film and removing the metal thin film which has not reacted.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A structure of a high resistance load-type SRAM in accordance with a first embodiment of the present invention will now be described with reference to FIGS. 1–4.

Figure 1:
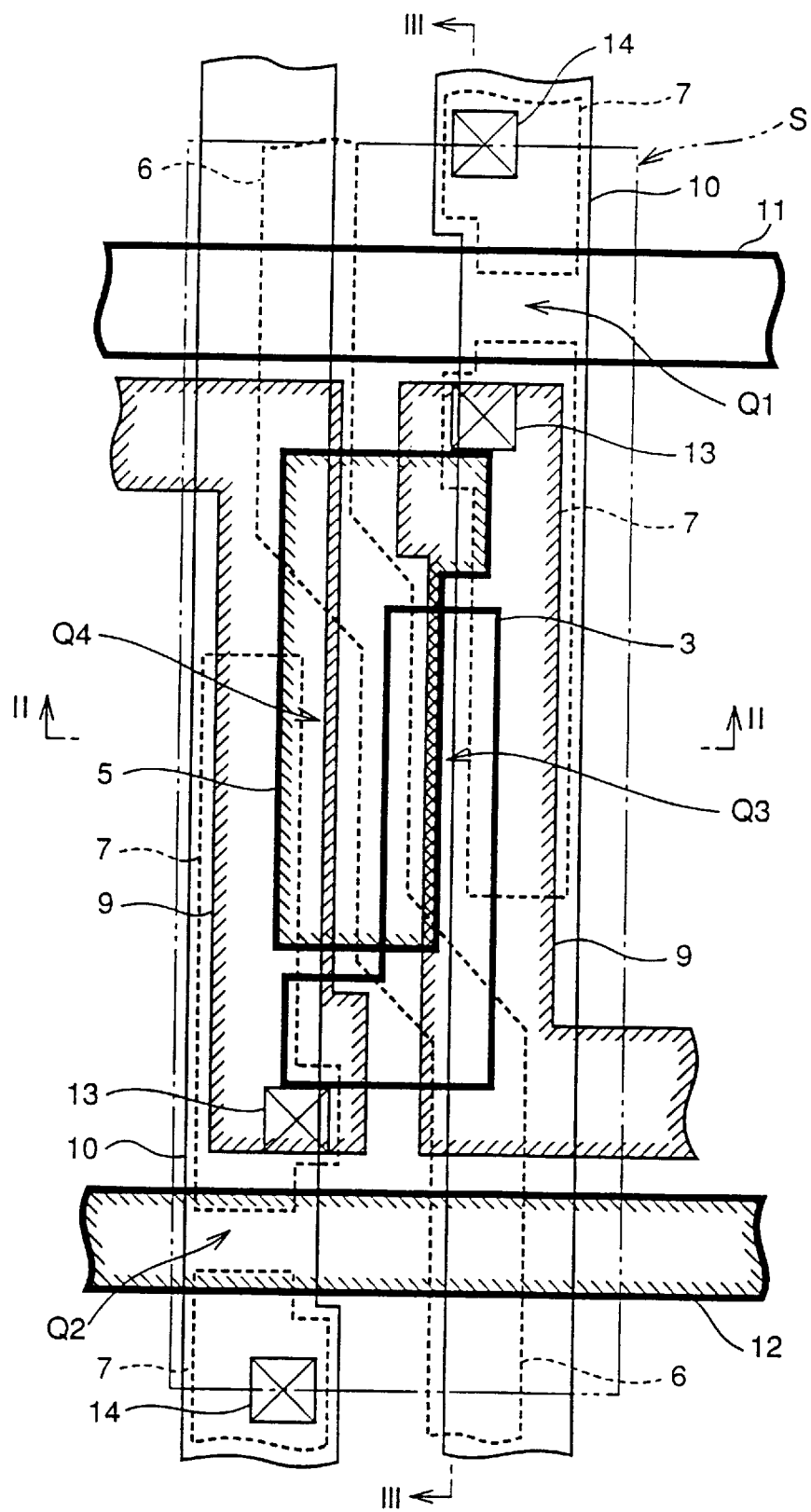
FIG. 1 is a plan view showing an arrangement of a high resistance load-type SRAM in accordance with a first embodiment of the present invention.
Figure 2:
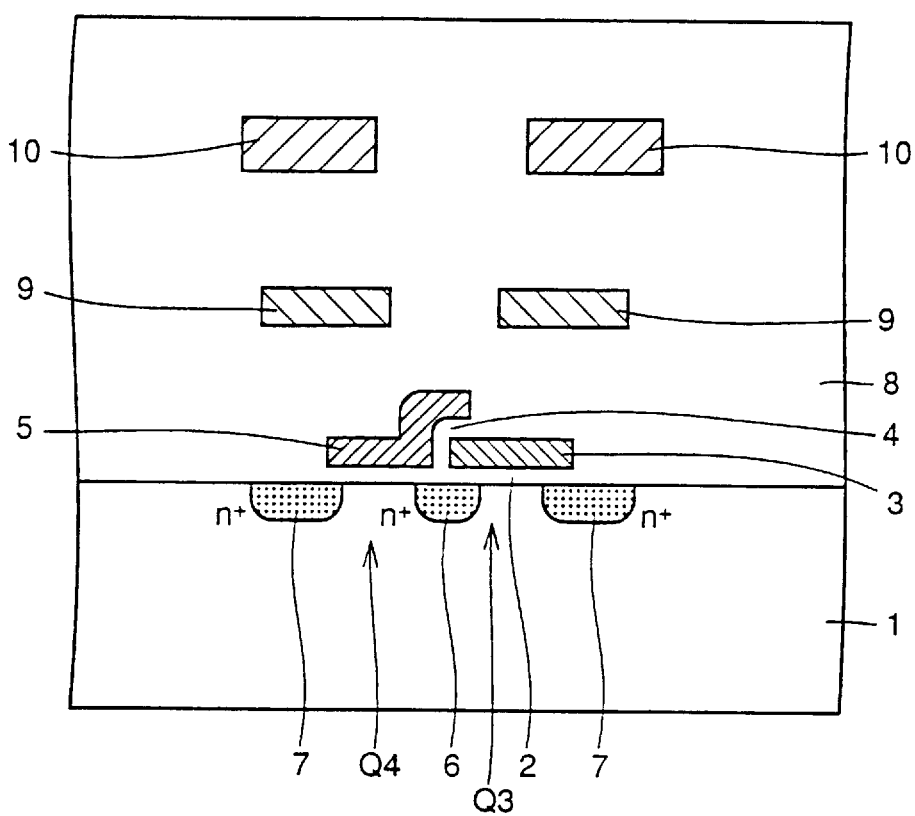
FIG. 2 is a cross section taken along the line II—II in FIG. 1.
Figure 3:
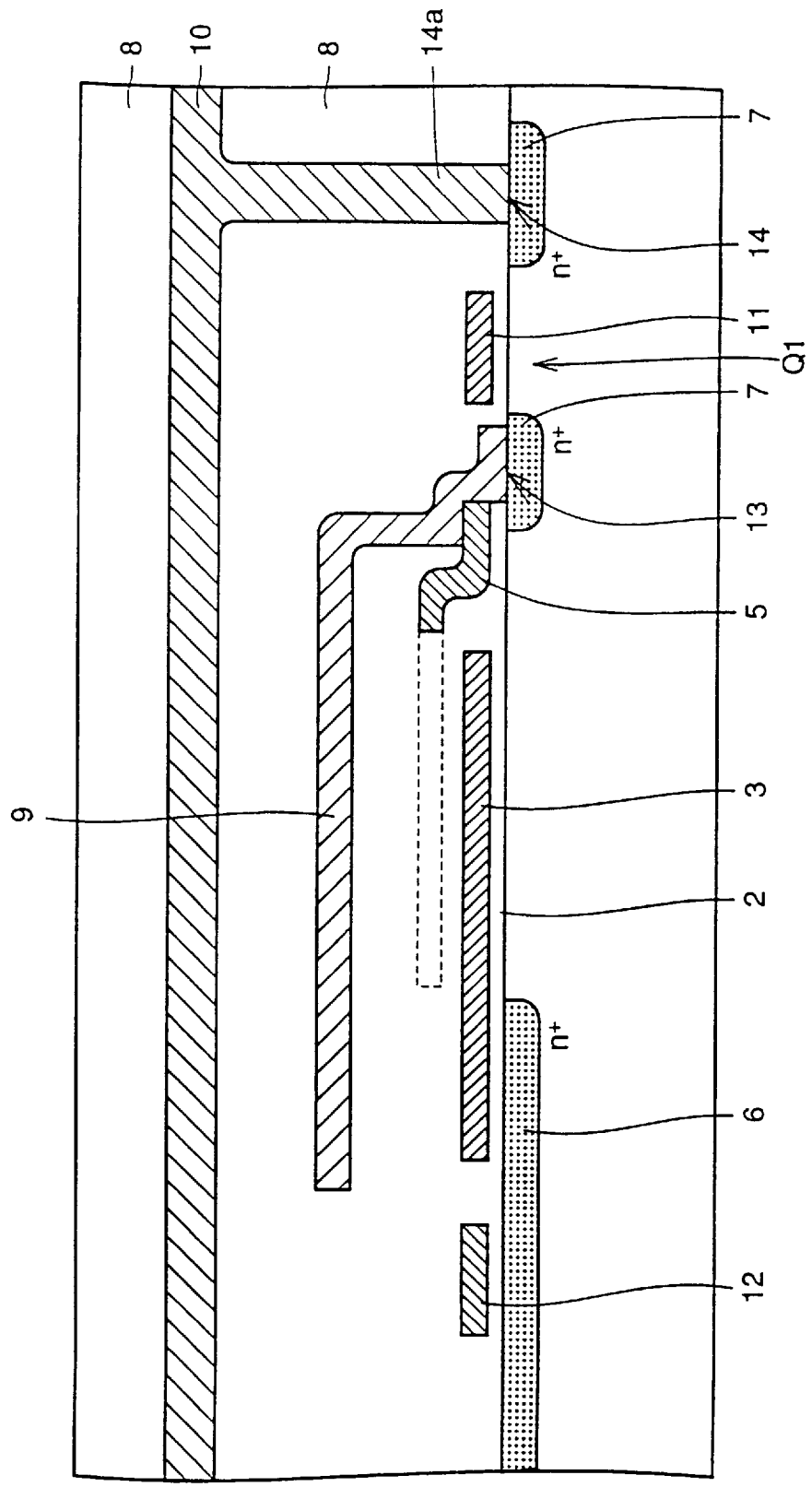
FIG. 3 is a cross section taken along the line III—III in FIG. 1.
Figure 4:
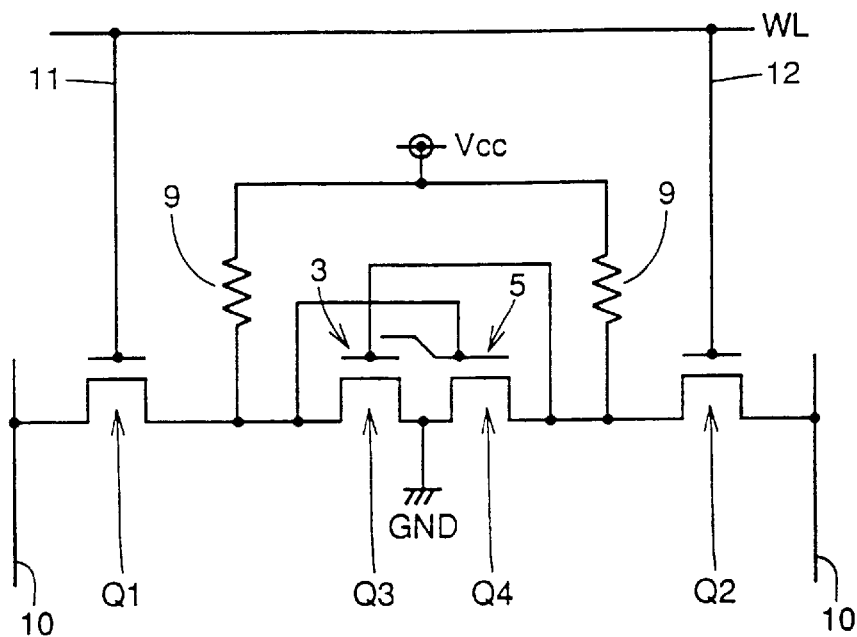
FIG. 4 is a diagram showing an equivalent circuit of the high resistance load-type SRAM in accordance with the first embodiment of the present invention shown in FIGS. 1–3.

FIG. 1 is a plan view showing an arrangement of the SRAM in accordance with the first embodiment of the present invention, and FIGS. 2 and 3 are cross sections taken along the lines II—II and III—III in FIG. 1, respectively. FIG. 4 shows an equivalent circuit of the SRAM.

In the present embodiment, a gate electrode 3 of a driver transistor Q3 is formed on a main surface of a semiconductor substrate 1 with a gate insulating film 2 therebetween, and n-type impurity diffusion layers 6 and 7 which constitute source and drain regions of driver transistor Q3, respectively, are formed so as to sandwich a channel region under the gate electrode 3 therebetween. Gate electrode 3 forms a first conductor of the present invention.

A gate electrode 5 of a driver transistor Q4 is formed near a side surface of gate electrode 3 on the side of an impurity diffusion layer 6 with an insulating film 4 therebetween, so that gate electrode 5 has its one end on the side of impurity diffusion layer 6 extended over one end of gate electrode 3. This gate electrode 5 forms a second conductor of the present invention. Gate electrode 3 is formed by patterning a first polycrystalline silicon layer to which impurity has been doped, and gate electrode 5 is formed by patterning a second polycrystalline silicon layer which has been formed separately from the first polycrystalline silicon layer and to which impurity has been doped. The n-type impurity diffusion layer 6 is a common source region to gate electrodes 3 and 5, and impurity diffusion layers 7 and 7 under the right end portion of gate electrode 3 and the left end portion of gate electrode 5 form drain regions of driver transistors Q3 and Q4, respectively.

A pair of high resistance loads 9 and 9 are formed above gate electrodes 3 and 5, respectively, with an interlayer insulating film 8 therebetween. These high resistance loads 9, 9 are formed by patterning a third polycrystalline silicon layer which has been formed separately from the first and second polycrystalline silicon layers and to which impurity has been doped, and a high resistance portion thereof is formed by shielding it from impurity using a mask at the time of doping of impurity and thereby reducing an amount of impurity introduced.

A pair of bit lines 10 and 10 made of an aluminum interconnection, for example, are formed above high resistance loads 9 and 9. The bit line 10 is electrically connected at contact 14 to impurity diffusion layer 7 which forms a source or a drain region of an access transistor Q1 through a contact hole 14a. High resistance load 9 is electrically connected to impurity diffusion layer 7 which forms a source or a drain region of access transistor Q1, at a contact 13. High resistance load 9 is connected to gate electrode 5 above a contact 13. A power supply potential Vcc is applied to high resistance load 9, 9 at its end opposite to contact 13.

Gate electrodes 3 and 5 of access transistors Q1 and Q2 are connected to word lines 11 and 12, respectively. Word line 11 is formed by patterning the first polycrystalline silicon layer simultaneously with the formation of gate electrode 3 of driver transistor Q3, and word line 12 is formed by patterning the second polycrystalline silicon layer simultaneously with the formation of gate electrode 5 of driver transistor Q4.

Figure 30:
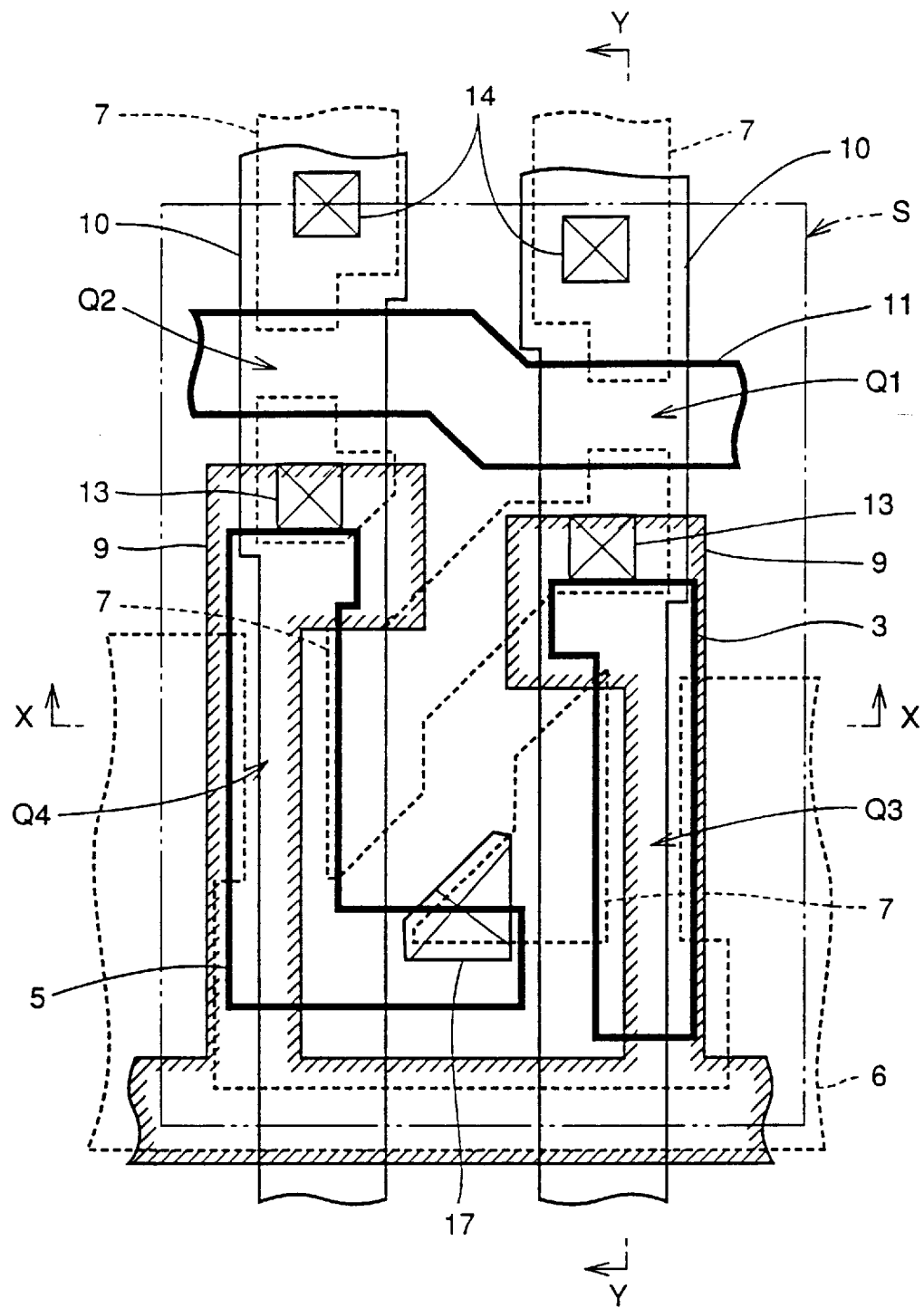
FIG. 30 is a plan view showing an arrangement of a conventional high resistance load-type SRAM.
Figure 31:
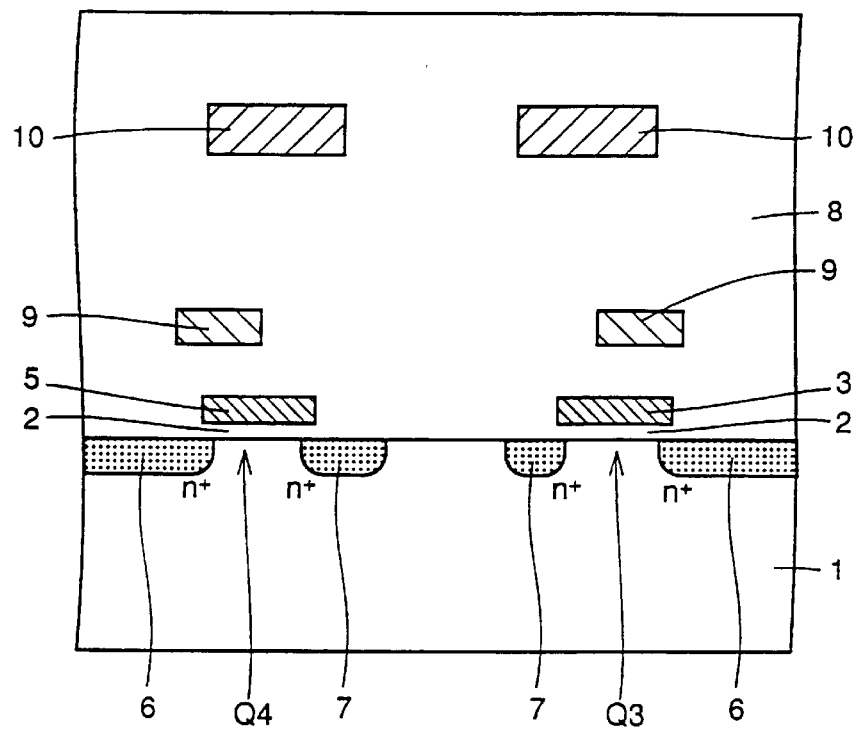
FIG. 31 is a cross section taken along the line X—X in FIG. 30.
Figure 32:
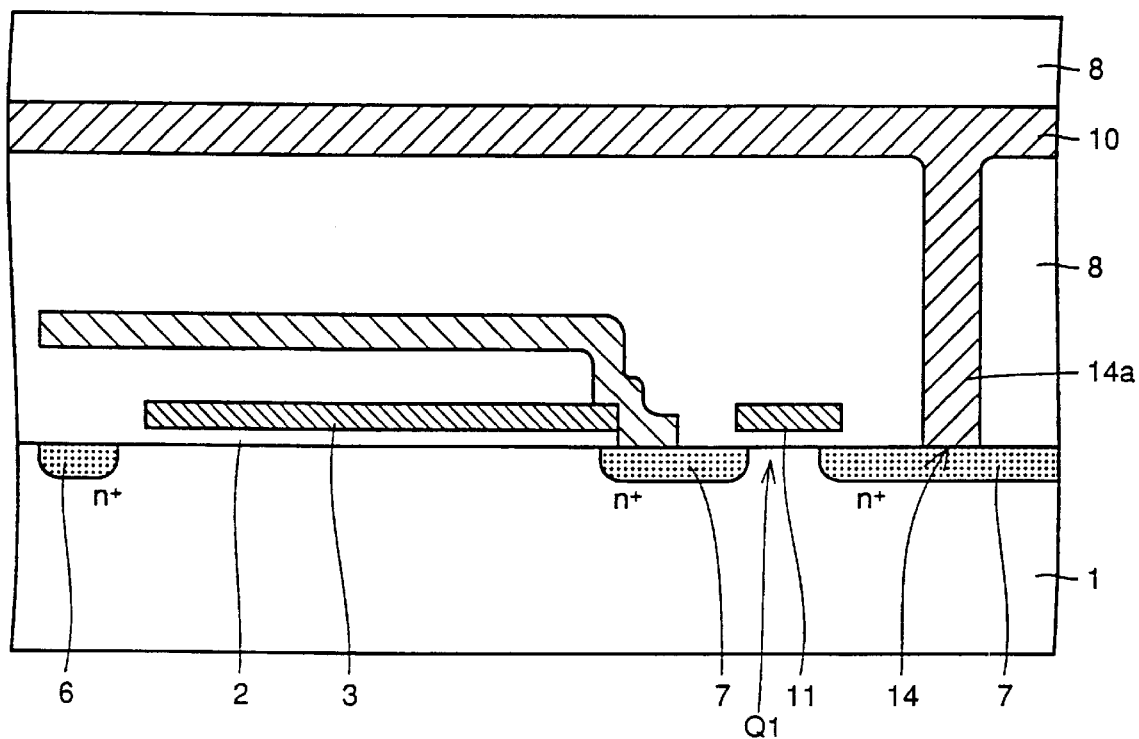
FIG. 32 is a cross section taken along the line Y—Y in FIG. 30.

Area per unit memory cell of the SRAM in accordance with the first embodiment shown in FIG. 1 is an area of a rectangular region s shown by the chain two-dotted line in FIG. 1, i.e. 6 μm wide×17 μm long=102 μm² in real size. Area per unit memory cell of the conventional high resistance load-type SRAM shown in FIG. 30 is an area of a region S shown by the chain two-dotted line in FIG. 30, i.e. 9 μm wide×13 μm long=117 μm² in real size. Accordingly, by using a structure of the SRAM in accordance with the first embodiment, area per unit memory cell thereof can be reduced to about 87% of that of the conventional memory cell.

A method of manufacturing the SRAM of the first embodiment with an arrangement such as above will now be described with reference to FIGS. 5A–8C.

Figure 5A:
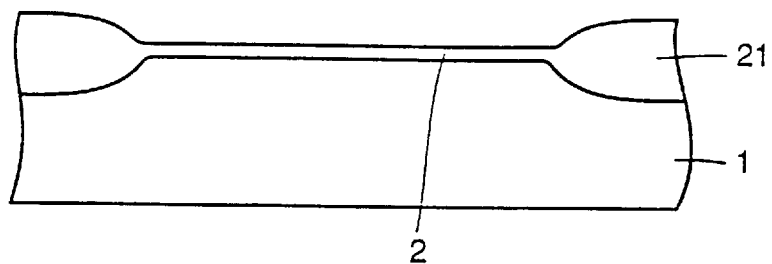
FIGS. 5A–5D and FIGS. 6A–6D are cross sections corresponding to that taken along the line II—II in FIG. 1, showing first to eighth steps of a manufacturing method of the high resistance load-type SRAM in accordance with the first embodiment of the present invention shown in FIGS. 1–3, respectively.

In a manufacturing process of the SRAM of the present embodiment, referring to FIG. 5A, an element isolation region 21 is formed at a main surface of a semiconductor substrate 1 made of monocrystalline silicon, for example, by LOCOS (LOCal Oxidation of Silicon), and then, a gate insulating film 2 is formed by thermal oxidation on an active region of the surface of semiconductor substrate 1, which is surrounded by element isolation region 21.

Figure 5B:
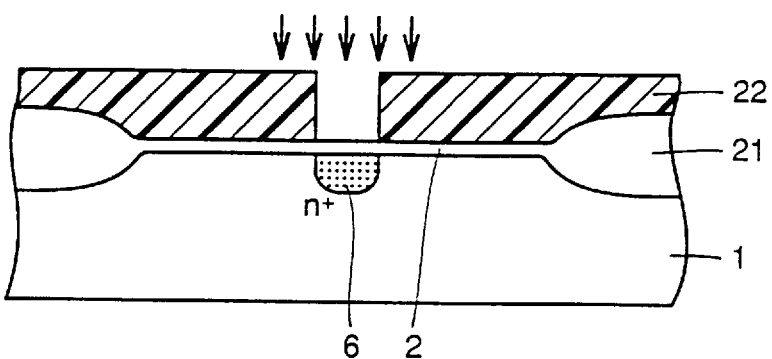
Figure 5C:
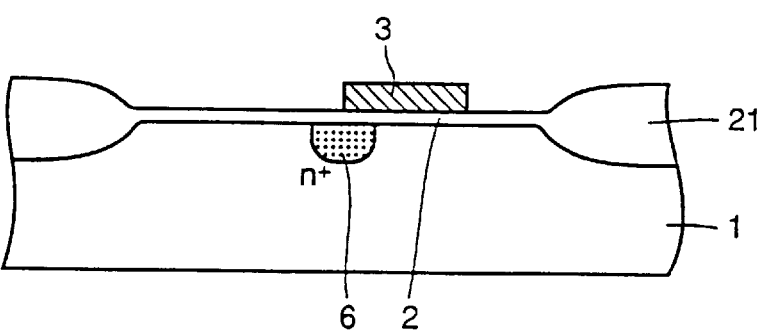
Figure 5D:
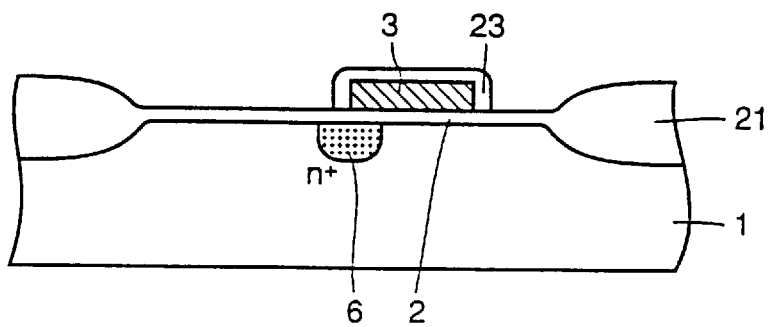

Then, referring to FIG. 5B, a resist mask 22 is formed by patterning with a portion of the active region being exposed, and an n-type impurity diffusion layer 6 is formed by implanting n-type impurity such as phosphorus, arsenic or the like using resist mask 22 as a mask. Then, referring to FIG. 5C, a first polycrystalline silicon layer is formed on the whole main surface of semiconductor substrate 1 after removal of resist mask 22, and then, a gate electrode 3 of a driver transistor Q3 is formed on a position where n-type impurity diffusion layer 6 forms a source region of an MOS-type field effect transistor. Then, referring to FIG. 5D, an insulating film 23 is formed to cover side and top surfaces of gate electrode 3.

Figure 6A:
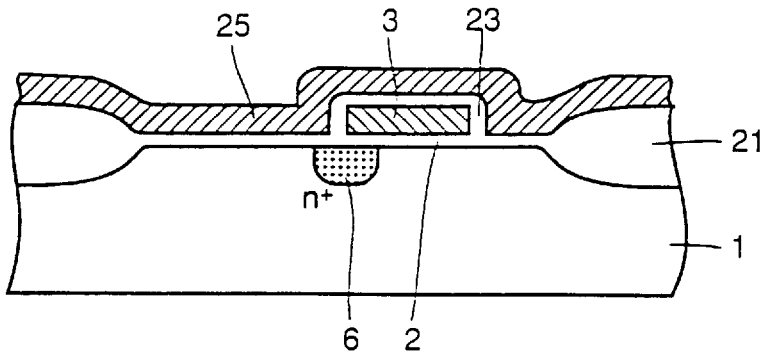
Figure 6B:
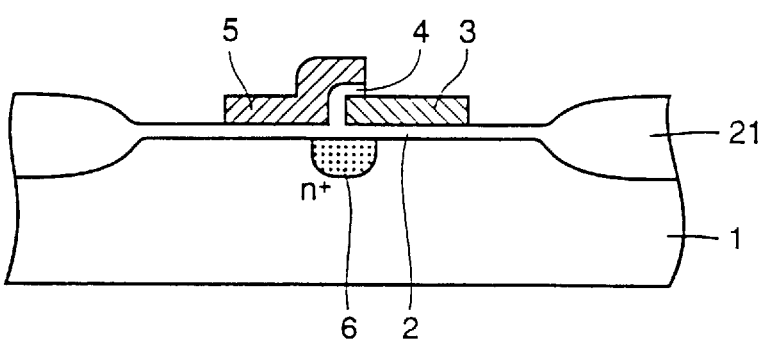
Figure 6C:
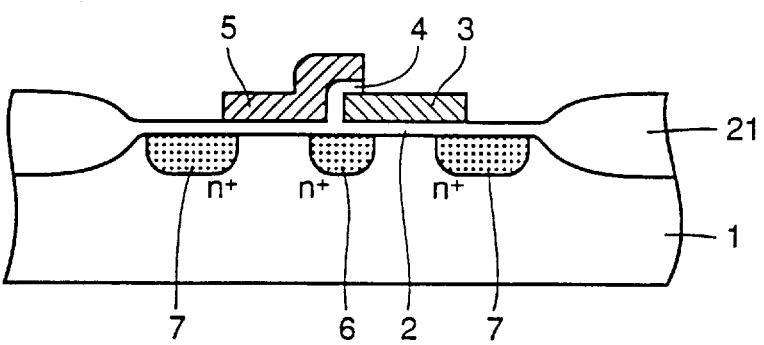
Figure 6D:
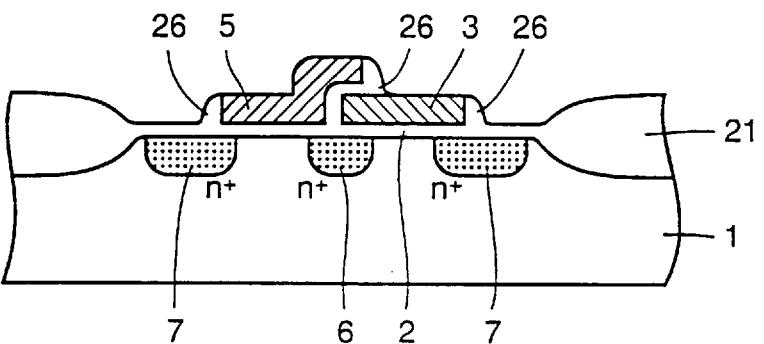

Referring to FIG. 6A, a second polycrystalline silicon layer 25 is formed on the whole surface of semiconductor substrate 1, for example, by CVD, and then, the second polycrystalline silicon layer 25 is patterned in such a manner as shown in FIG. 6B. Then, n-type impurity such as phosphorus, arsenic or the like is implanted, using gate electrodes 3 and 5 as well as element isolation region 21 as a mask, whereby n-type impurity layers 7 and 7, which form drain regions of driver transistors Q3 and Q4, respectively, are formed (see FIG. 6C). After that, an insulating film such as a silicon oxide film or the like of a prescribed thickness is formed on the whole surface of semiconductor substrate 1, for example, by CVD, and a sidewall insulating film 26 is formed on each of side surfaces of gate electrodes 3 and 5 by anisotropic etching (see FIG. 6D).

Figure 7A:
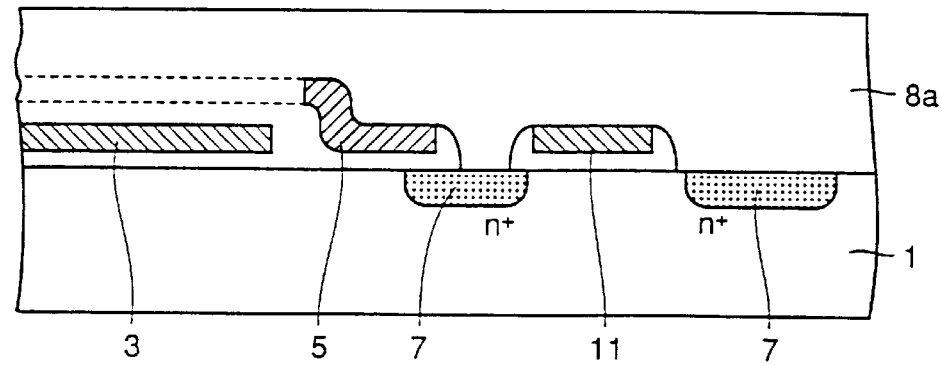
FIGS. 7A–7C and FIGS. 8A–8C are cross sections corresponding to that taken along the line III—III in FIG. 1, showing ninth to fourteenth steps of the manufacturing method of the high resistance load-type SRAM in accordance with the first embodiment of the present invention shown in FIGS. 1–3, respectively.
Figure 7B:
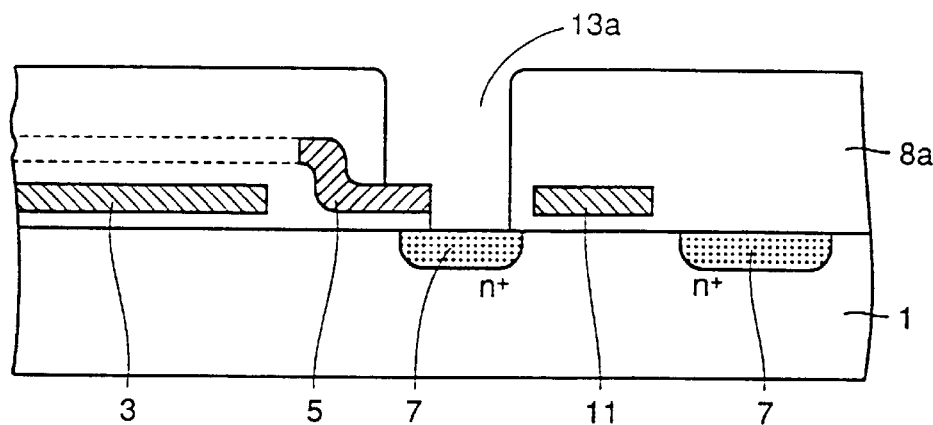
Figure 7C:
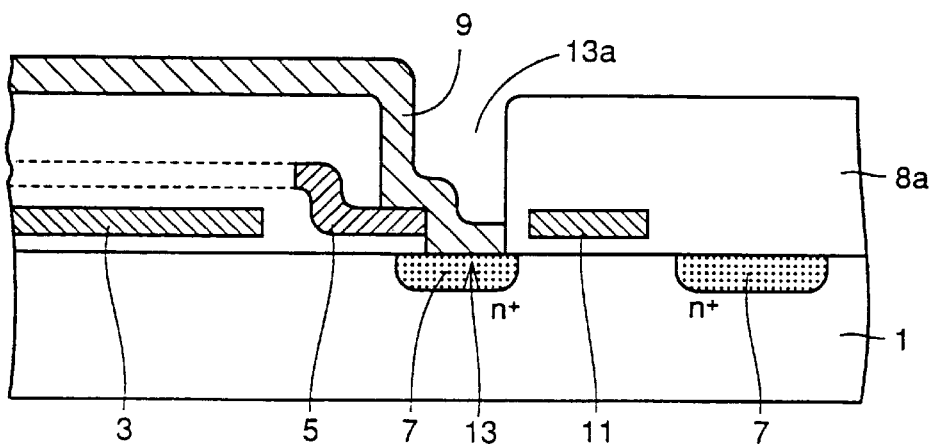

Then, referring to FIG. 7A, an insulating film such as a silicon oxide film is formed on the whole main surface of semiconductor substrate 1, for example, by CVD, and is made flat. Insulating film 8a is anisotropically etched and a contact hole 13a is formed at a region where a contact 13 is to be formed (see FIG. 7B). Then, a third polycrystalline silicon layer of a prescribed thickness is formed on the whole surface of semiconductor substrate 1 including an inner surface of contact hole 13a, and a high resistance load 9, which is connected to impurity diffusion layer 7 at contact 13, is formed by patterning the third polycrystalline silicon layer as shown in FIG. 7C. Setting of resistance of high resistance load 9 is carried out by appropriately setting an amount of impurity which is implanted to a portion to be made highly resistive, for example, by masking that portion at the time of implantation of impurity for adding conductivity thereto after patterning of the third polycrystalline silicon layer.

Figure 8A:
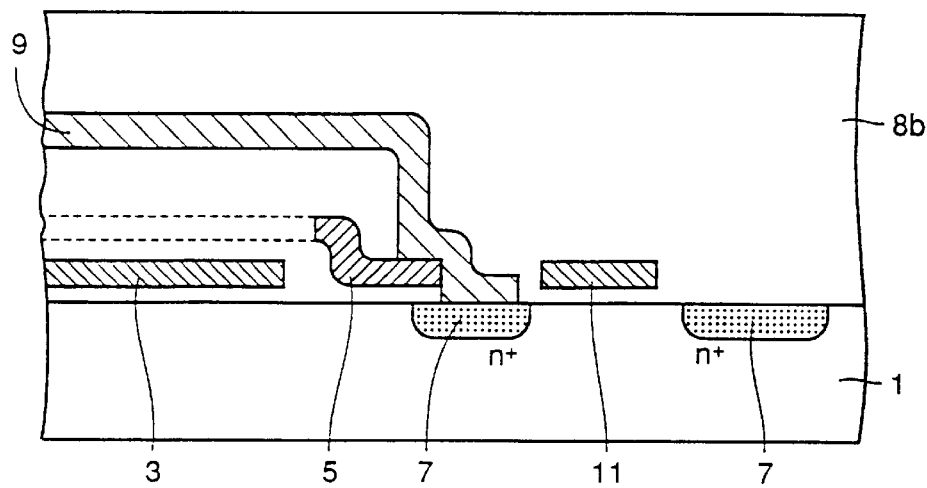
Figure 8B:
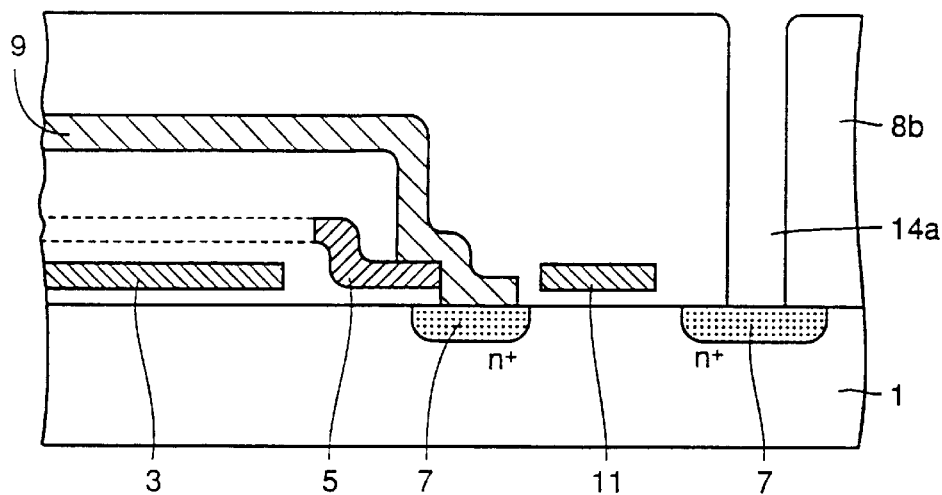
Figure 8C:
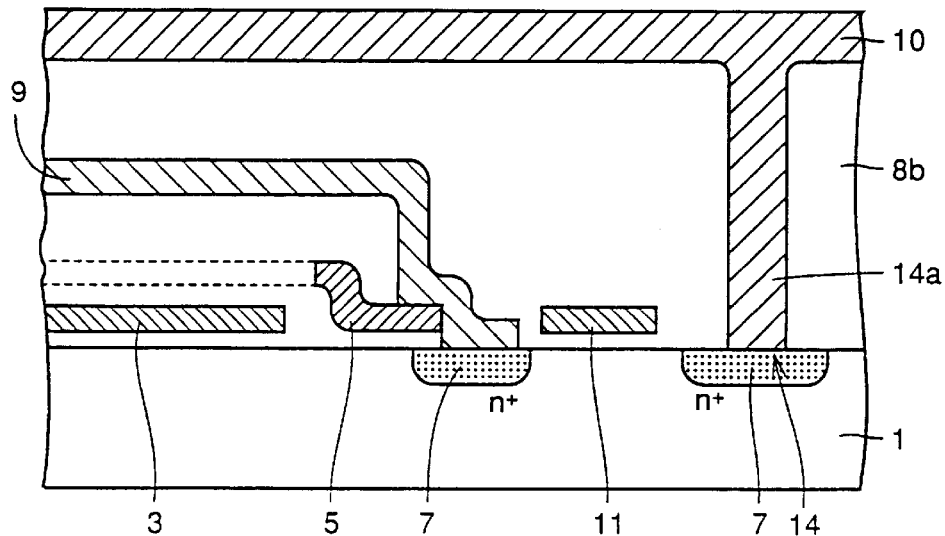

Then, referring to FIG. 8A, an insulating film 8b is deposited on the whole surface of semiconductor substrate 1, for example, by CVD and is made flat. Referring to FIG. 8B, a contact hole 14a is formed at a region of insulating film 8b where a contact 14 is to be formed, and then, a bit line 10, which is electrically connected to impurity diffusion layer 7 at contact 14 through contact hole 14a, is formed, for example, by sputtering (see FIG. 8C).

Since the SRAM in accordance with the present embodiment is formed by such a manufacturing process as described above, gate electrodes 3 and 5 which are close to each other are formed by patterning separate polycrystalline silicon layers. Therefore, distance between gate electrodes 3 and 5 can be set by thickness of insulating film 4, and are always insulated from each other. When the gate electrodes which are close to each other are formed by patterning the same polycrystalline silicon layer, as in the above-described conventional manufacturing process, for example, distance between the gate electrodes becomes larger than the smallest possible distance implemented by patterning. In addition, short-circuit between adjacent gate electrodes might occur because of etching residue or the like at the time of patterning. However, by applying such a manufacturing process as in the present embodiment, such problems are solved, and two gate electrodes which share a source region can be formed close to each other as in the SRAM of the present embodiment, resulting in higher degree of integration of a memory cell of SRAM.

A second embodiment of the present invention will now be described with reference to FIGS. 9–12.

An SRAM in accordance with the second embodiment is a high resistance load-type SRAM having approximately the same structure as that of the first embodiment. The SRAM of the second embodiment is different from that of the first embodiment in that a conductive thin film 6a is formed on a top surface of an impurity diffusion layer 6 which forms a source region of driver transistors Q3 and Q5. This conductive thin film is formed, for example, of cobalt salicide ($CoSi_2$) film, and preferably has a thickness in the range from about 500 to about 1000 Å. By formation of such a cobalt salicide film, sheet resistance of the n-type impurity diffusion layer, which is normally 90 $\Omega/\mu m^2$, can be reduced to about 3.5 $\Omega/\mu m^2$.

Figure 10:
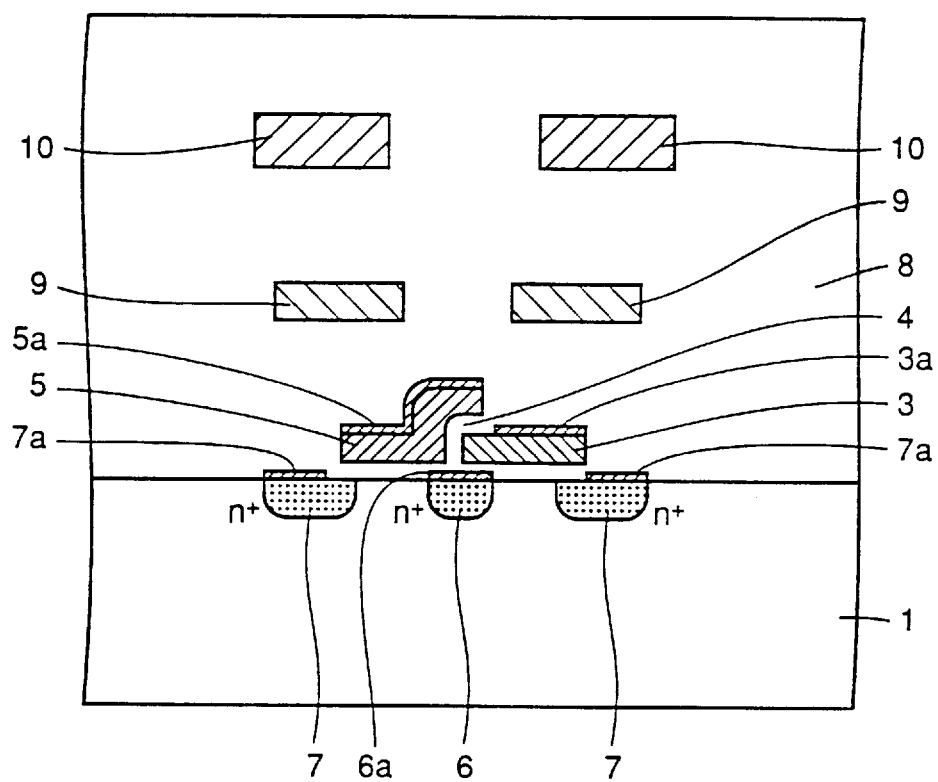
FIG. 10 is a cross section corresponding to that of FIG. 9, showing a modification of the high resistance load-type SRAM in accordance with the second embodiment of the present invention.

Reduction in resistance can be achieved not only in n-type impurity diffusion layer 6 but also gate electrodes 3 and 5 as well as n-type impurity diffusion layers 7 and 7 by forming conductive metal thin film 3a, 5a, and 7a on top surfaces thereof, respectively, as shown in FIG. 10. When the above-described cobalt salicide film is formed on the top surfaces of the polycrystalline silicon layers which form gate electrodes 3 and 5, sheet resistance of the polycrystalline silicon layer itself is reduced from about 280 $\Omega/\mu m^2$ to about 3.5 $\Omega/\mu m^2$. Although platinum, titanium or the like may be used as such a conductive metal thin film other than cobalt salicide, they are more expensive than cobalt.

Figure 9:
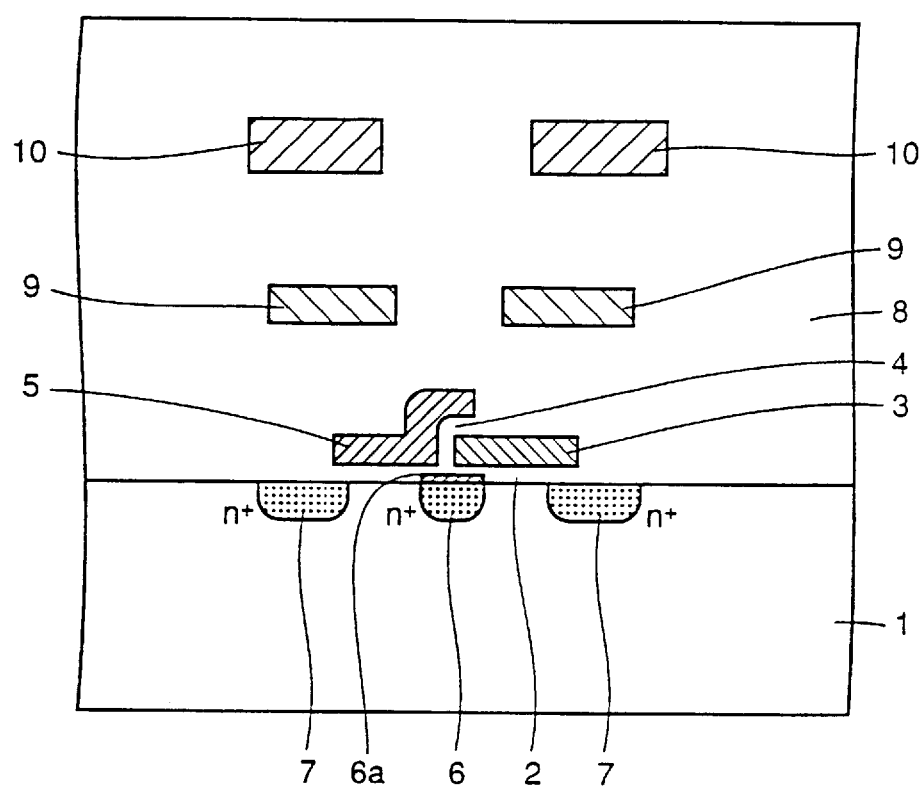
FIG. 9 is a cross section corresponding to that taken along the line II—II in FIG. 1, showing a high resistance load-type SRAM in accordance with a second embodiment of the present invention.
Figure 11:
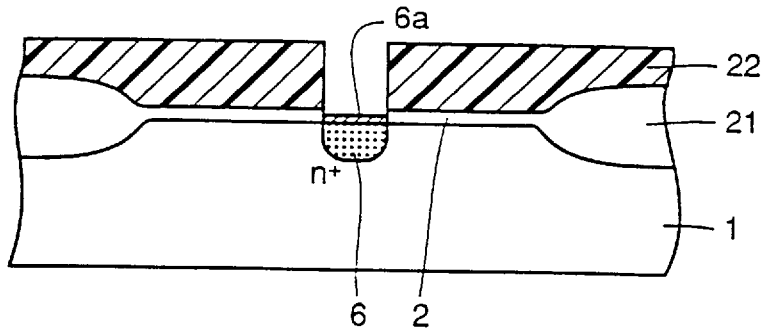
FIG. 11 is a cross section illustrating a method of forming a conductive metal thin film 6a shown in FIG. 9.

Referring to FIG. 11, the conductive thin film shown in FIG. 9 is formed as follows. An insulating film 2 on the top surface of n-type impurity diffusion layer 6 is removed by etching, using the same resist mask 22 as that was used for formation of n-type impurity diffusion layer 6 and then, a cobalt film of a thickness in the range from about 500 to about 1000 Å is formed on the top surface, which has been exposed by etching, of the n-type impurity diffusion layer. Then, the cobalt film and silicon of semiconductor substrate 1 are made to react with each other by heating, and conductive metal thin film 6a of cobalt salicide film is formed.

Figure 12A:
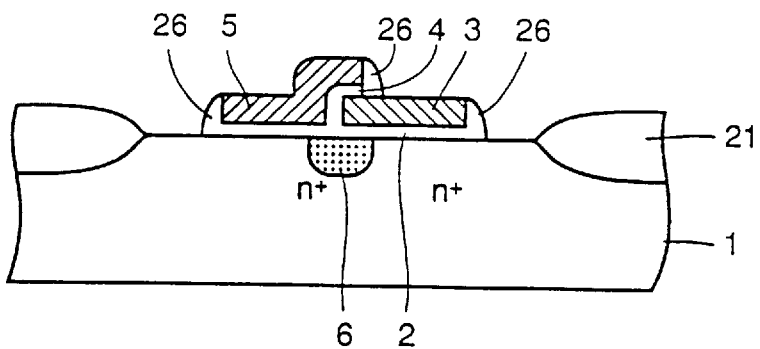
FIGS. 12A–12C are cross sections illustrating a method of forming conductive metal thin films 3a, 5a and 7a shown in FIG. 10.
Figure 12B:
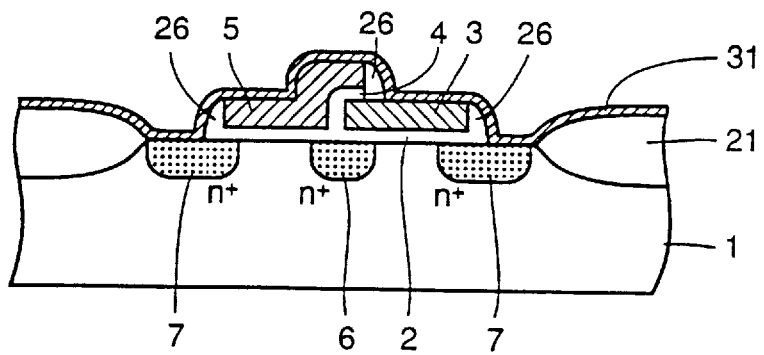
Figure 12C:
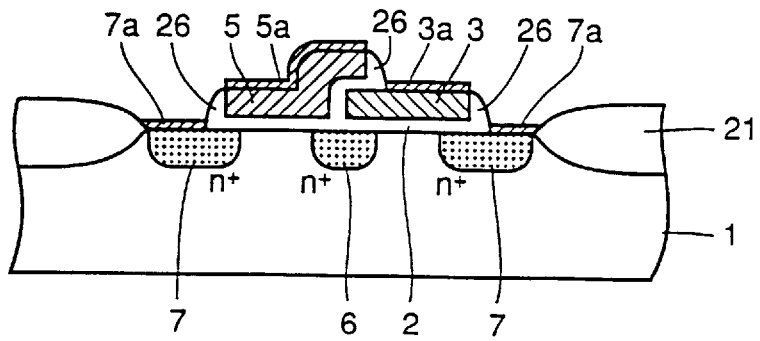

Referring to FIGS. 12A–12C, the structure shown in FIG. 10 is formed as follows. After an insulating film such as an oxide film or the like is formed, for example, by CVD, on the whole main surface of semiconductor substrate 1 on which gate electrodes 3 and 5 have been formed, it is anisotropically etched and sidewall insulating films 26 are formed on side surfaces of gate electrodes 3 and 5 (see FIG. 12A). At this time, top surfaces of gate electrodes 3 and 5 as well as a portion of the surface of semiconductor substrate 1 where impurity diffusion layer 7 is to be formed are exposed. After n-type impurity is implanted with those top surfaces and the portion exposed and n-type impurity diffusion layers 7 and 7 are formed, a cobalt thin film 31 is formed on the whole surface of semiconductor substrate 1 in such a manner as shown in FIG. 12B. Then, when polycrystalline silicon of gate electrodes 3 and 4 as well as silicon of semiconductor substrate 1 are made to react with cobalt film 31 by heating and the cobalt film which has not reacted with silicon is removed, conductive metal thin films 3a, 5a and 7a made of cobalt salicide film and having a thickness in the range from about 500 to about 1000 Å are formed on the exposed top surfaces of gate electrodes 3 and 5 as well as impurity diffusion layers 7 and 7 as shown in FIG. 12C.

Thus, a conductive metal thin film is formed in a self-aligning manner on a desired region by a relatively simple process.

Figure 13:
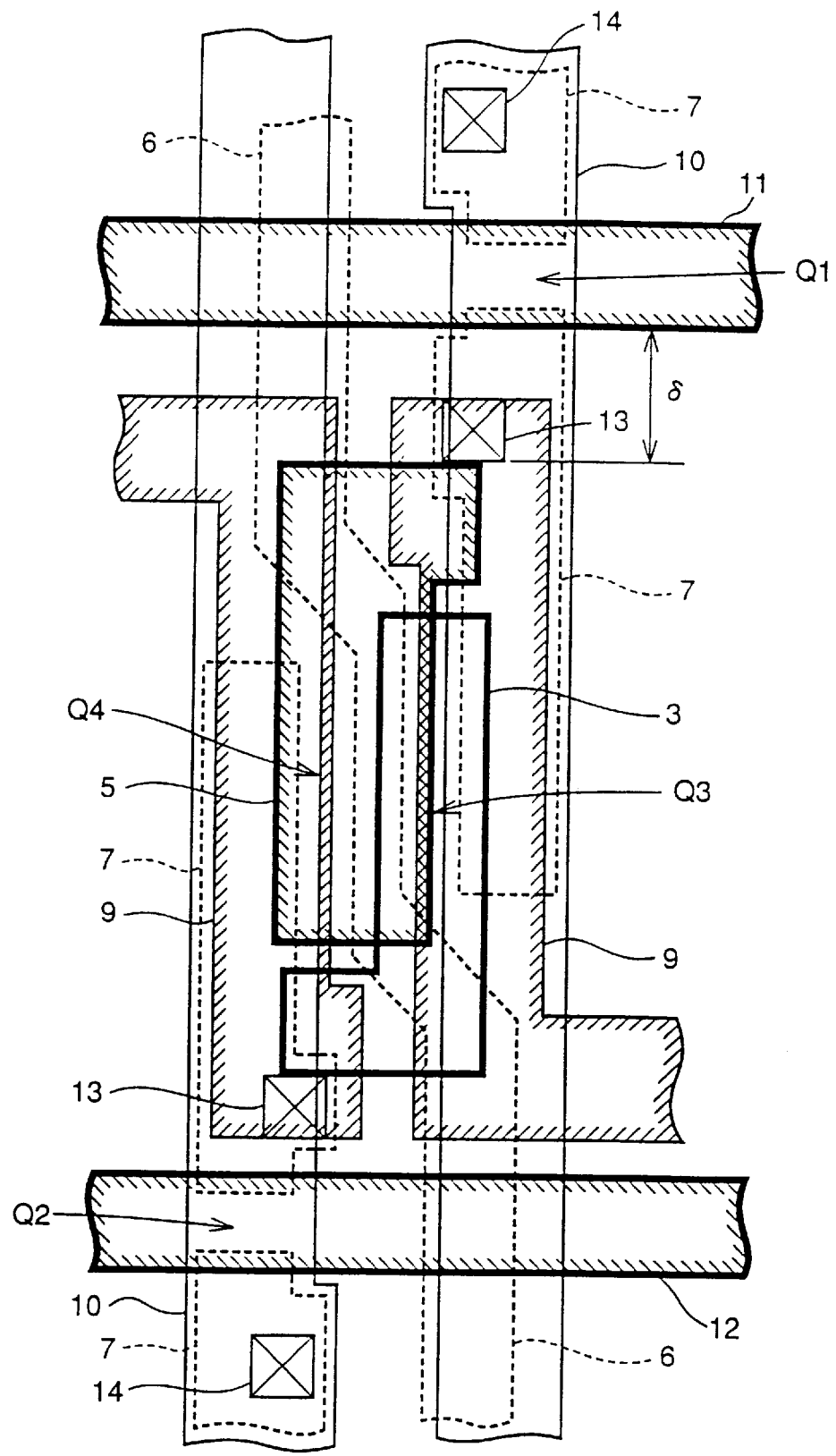
FIG. 13 is a plan view showing an arrangement of a high resistance load-type SRAM in accordance with a third embodiment of the present invention.

A structure of an SRAM in accordance with a third embodiment of the present invention will now be described with reference to FIG. 13. The structure of the SRAM of the third embodiment is different from that of the first embodiment in that distance 6 between a word line 11 and a gate electrode 5 of a driver transistor Q4 is increased and word line 11 is formed by patterning the same second polycrystalline silicon layer as that used for formation of gate electrode 5 and word line 12. In this case, although area per unit memory cell increases by the amount of increase in distance 6, word lines 11 and 12 which form gate electrodes of access transistors Q1 and Q2, respectively, can be formed by patterning the same polycrystalline silicon layer.

Formation of word lines 11 and 12 by patterning of the same polycrystalline silicon layer can be carried out by increasing the distance between gate electrode 3 and word line 12 instead of increasing the distance between gate electrode 5 and word line 11, and by forming word line 12 by patterning of the same first polycrystalline silicon layer as that used for formation of gate electrode 3.

Figure 14:
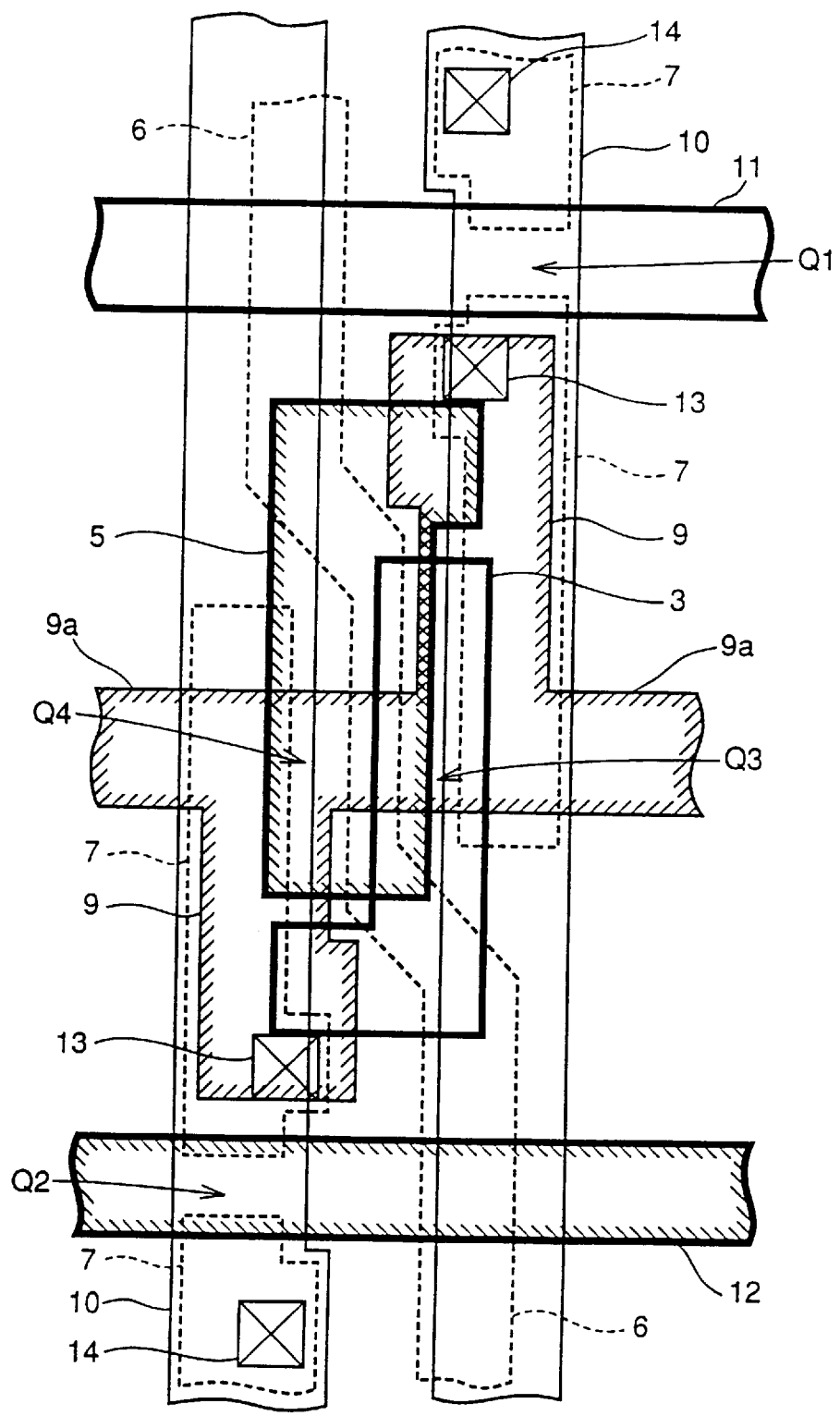
FIG. 14 is a plan view showing an arrangement of a high resistance load-type SRAM in accordance with a fourth embodiment of the present invention.

A fourth embodiment of the present invention will now be described with reference to FIG. 14. The fourth embodiment is different from the first embodiment in that a pair of high resistance loads 9 and 9 are connected with each other through a conductive interconnection 9a for applying Vcc, and in that these high resistance loads 9 and 9 as well as conductive interconnection 9a for applying Vcc are formed integrally by patterning the third polycrystalline silicon layer.

With such a structure, the high resistance loads and the interconnection for applying Vcc can be formed by patterning the same layer, and separate conductive interconnection made of an aluminum interconnection layer or the like for applying Vcc need not be formed. In formation of such a structure, after the third polycrystalline silicon layer, for example, of a prescribed thickness is formed on the whole surface of semiconductor substrate 1, it is patterned to have a shape of high resistance loads 9 and 9 as well as conductive interconnection 9a for applying Vcc. Then, impurity such as phosphorous, arsenic or the like is doped, with a portion which is to be high resistance loads 9 and 9 covered with a mask, whereby desired high resistance is provided to high resistance loads 9 and 9, and desired conductivity is provided to conductive interconnection layer 9a for applying Vcc.

Figure 15:
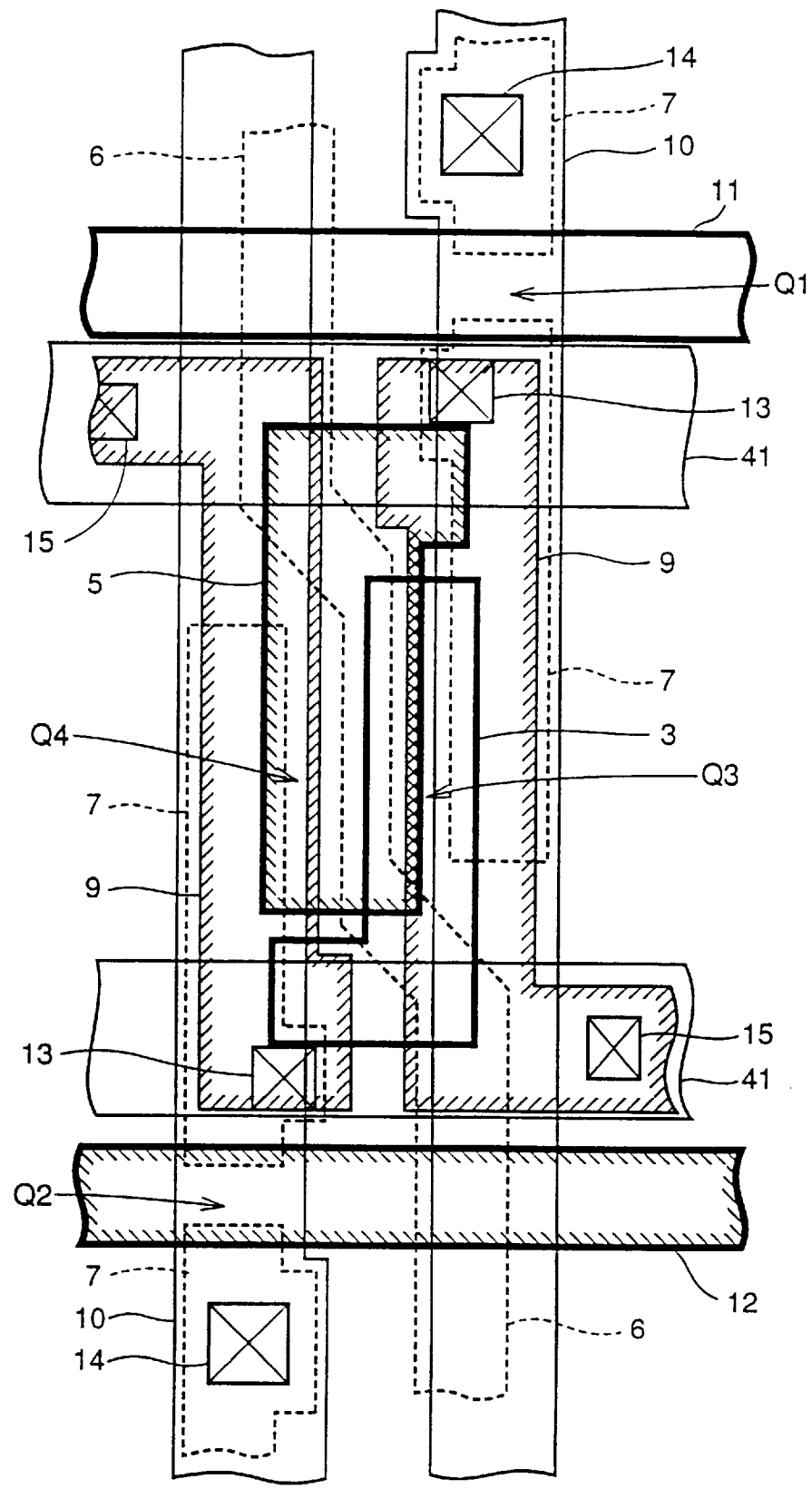
FIG. 15 is a plan view showing an arrangement of a high resistance load-type SRAM in accordance with a fifth embodiment of the present invention.

A fifth embodiment of the present invention will now be described with reference to FIG. 15. The fifth embodiment is different from the first and fourth embodiments in that conductive interconnections 41 and 41 for applying Vcc are formed by patterning a first aluminum interconnection layer and are electrically connected to high resistance loads 9 and 9 at contacts 15 and 15, respectively. In the present embodiment, bit lines 10 and 10 are formed by patterning a second aluminum interconnection layer which is formed above conductive interconnection 41.

Figure 16:
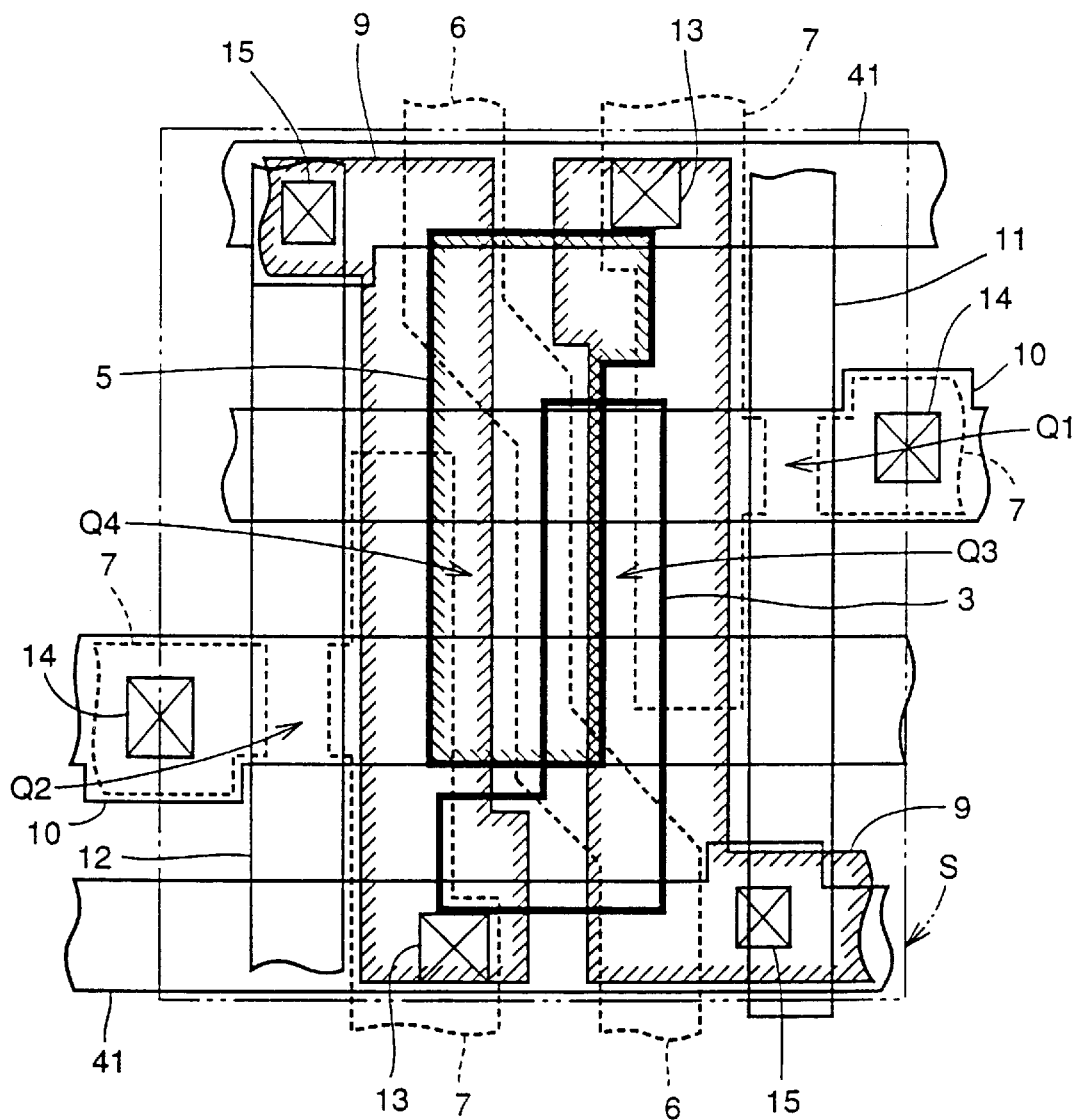
FIG. 16 is a plan view showing an arrangement of a high resistance load-type SRAM in accordance with a sixth embodiment of the present invention.

A sixth embodiment of the present invention will now be described with reference to FIG. 16. In a high resistance load-type SRAM in accordance with the present embodiment, word lines 11 and 12 are formed to extend in the direction of channel width of a pair of driver transistors Q3 and Q4, that is, in the longitudinal direction in FIG. 16, and a pair of bit lines 10 and 10 are formed to extend in the direction perpendicular thereto (direction of channel length of driver transistors Q3 and Q4), that is, in the lateral direction in FIG. 16. Conductive interconnections 41 and 41 for applying Vcc to high resistance loads 9 and 9, respectively, are placed parallel to bit lines 10 and 10. In this structure, bit lines 10 and 10 as well as conductive interconnections 41 and 41 for applying Vcc can be formed by patterning the same aluminum interconnection layer. In addition, since word lines 11 and 12 extend longitudinally, a pair of access transistors Q1 and Q2 can be placed outside impurity diffusion regions 7 which form drain regions of driver transistors Q3 and Q4. Consequently, area of a rectangle s which is shown by the chain two-dotted line in FIG. 16, that is, area per unit memory cell is 913 $\mu$m wide×10.5 $\mu$m long=97.65 $\mu$m$^2$, and therefore, area per unit memory cell is further reduced with respect to that in the above-described first embodiment.

Figure 17:
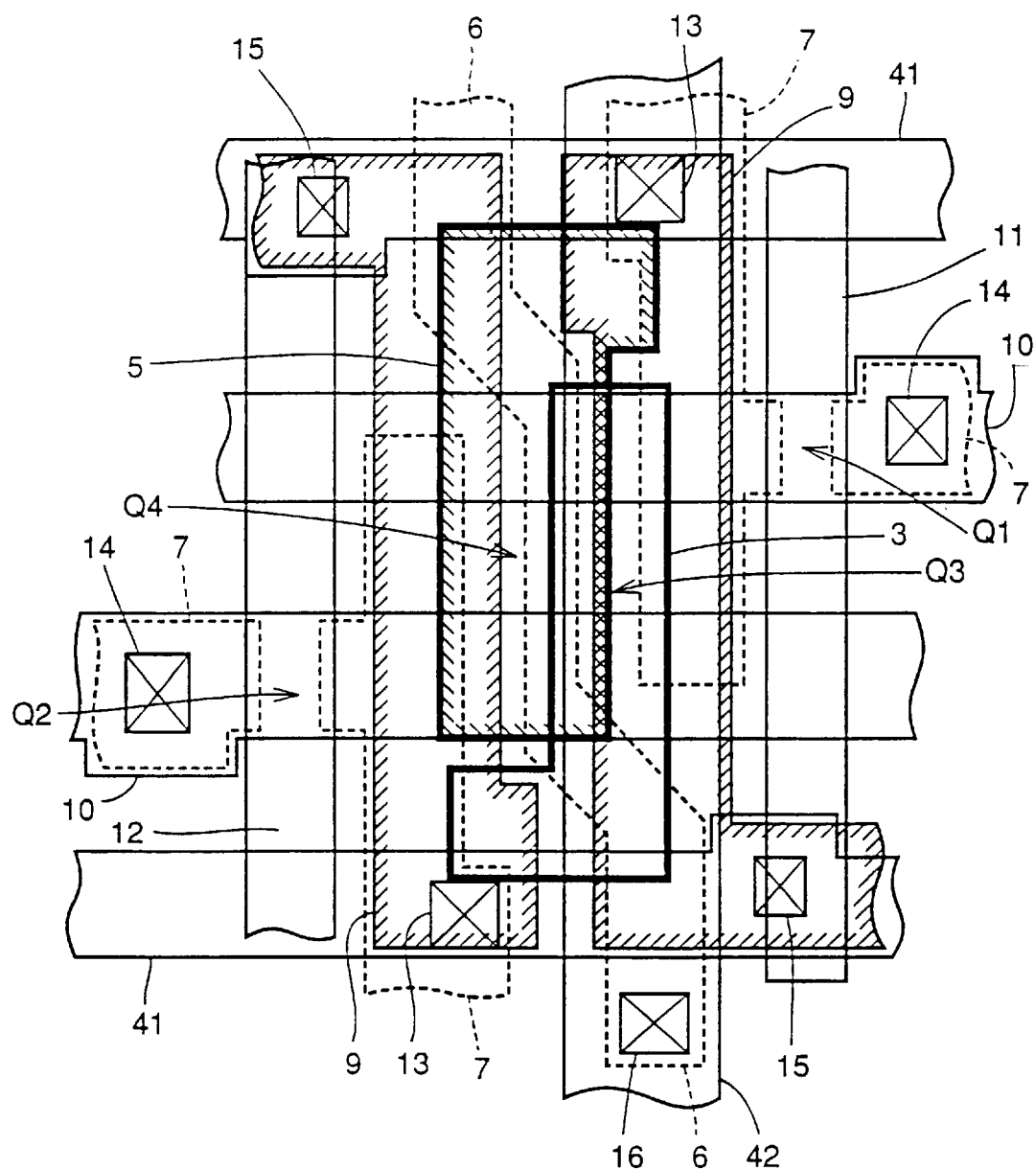
FIG. 17 is a plan view showing an arrangement of a high resistance load-type SRAM in accordance with a seventh embodiment of the present invention.

A seventh embodiment of the present invention will now be described with reference to FIG. 17. In a high resistance load-type SRAM in accordance with the present embodiment, a conductive interconnection layer 42 made of aluminum is formed to extend longitudinally in FIG. 17 in addition to the structure of the sixth embodiment shown in FIG. 16, and this conductive interconnection layer 42 is electrically connected at a contact 16 to an impurity diffusion layer 6 which forms a common source region of a pair of driver transistors Q3 and Q4. GND level potential is applied to this conductive interconnection layer 42, and thus potential at impurity diffusion layer 6 can be maintained stably at the GND level. This conductive interconnection 42 is formed by patterning a different aluminum interconnection layer from that is patterned to form bit lines 10 and 10 as well as conductive interconnection 41 and 41.

Figure 18:
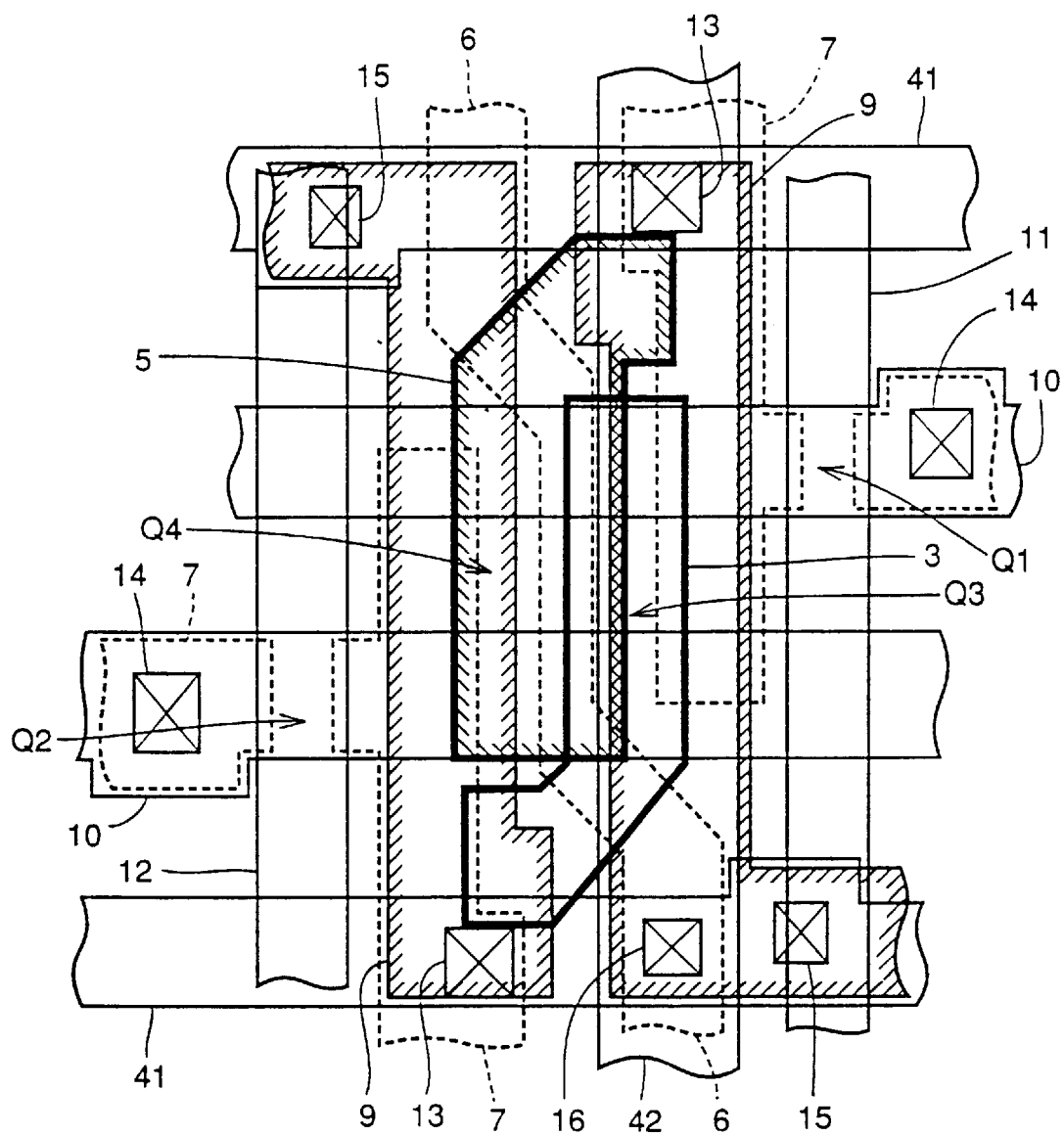
FIG. 18 is a plan view showing an arrangement of a high resistance load-type SRAM in accordance with an eighth embodiment of the present invention.

A eighth embodiment of the present invention will now be described with reference to FIG. 18. A structure of a high resistance load-type SRAM in accordance with the present embodiment is similar to that of the seventh embodiment shown in FIG. 17 except that corners of gate electrodes 3 and 5 are cut off at an angle of about 45°.

With such a structure, enough margin for formation of contacts 15 and 16 between conductive interconnections 41, 41 and 42, and impurity diffusion layers 6 and 7 can be obtained, and patterning at the time of forming a contact hole can be more readily performed.

Figure 19:
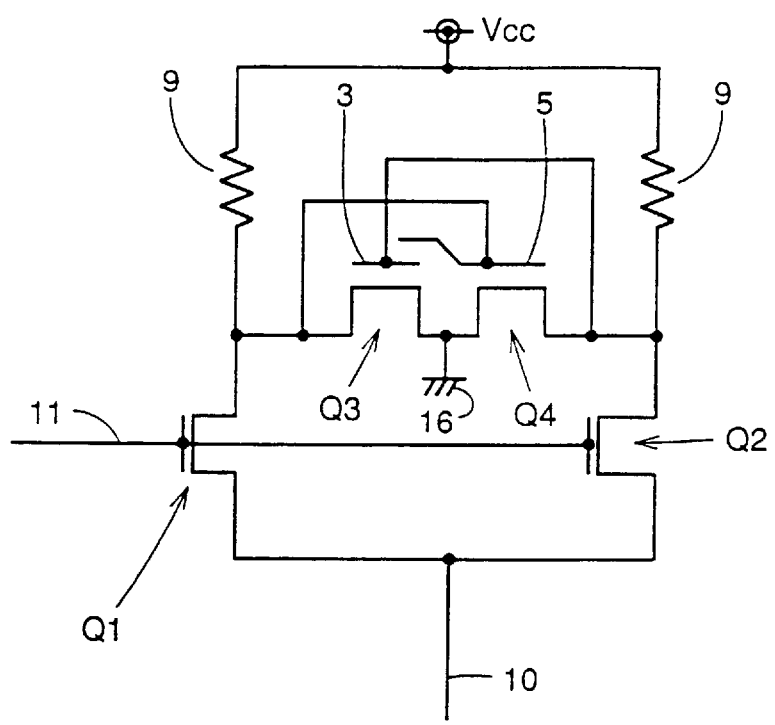
FIG. 19 is a diagram showing an equivalent circuit of a high resistance load-type SRAM in accordance with a ninth embodiment of the present invention.

A ninth embodiment of the present invention will now be described with reference to FIGS. 19 and 20. FIG. 19 shows an example of an equivalent circuit of a high resistance load-type SRAM of a single bit line-type in accordance with the present invention. In the single bit line type device, one bit line per unit memory cell is connected to a source or a drain region of access transistors Q1 and Q2.

Figure 20:
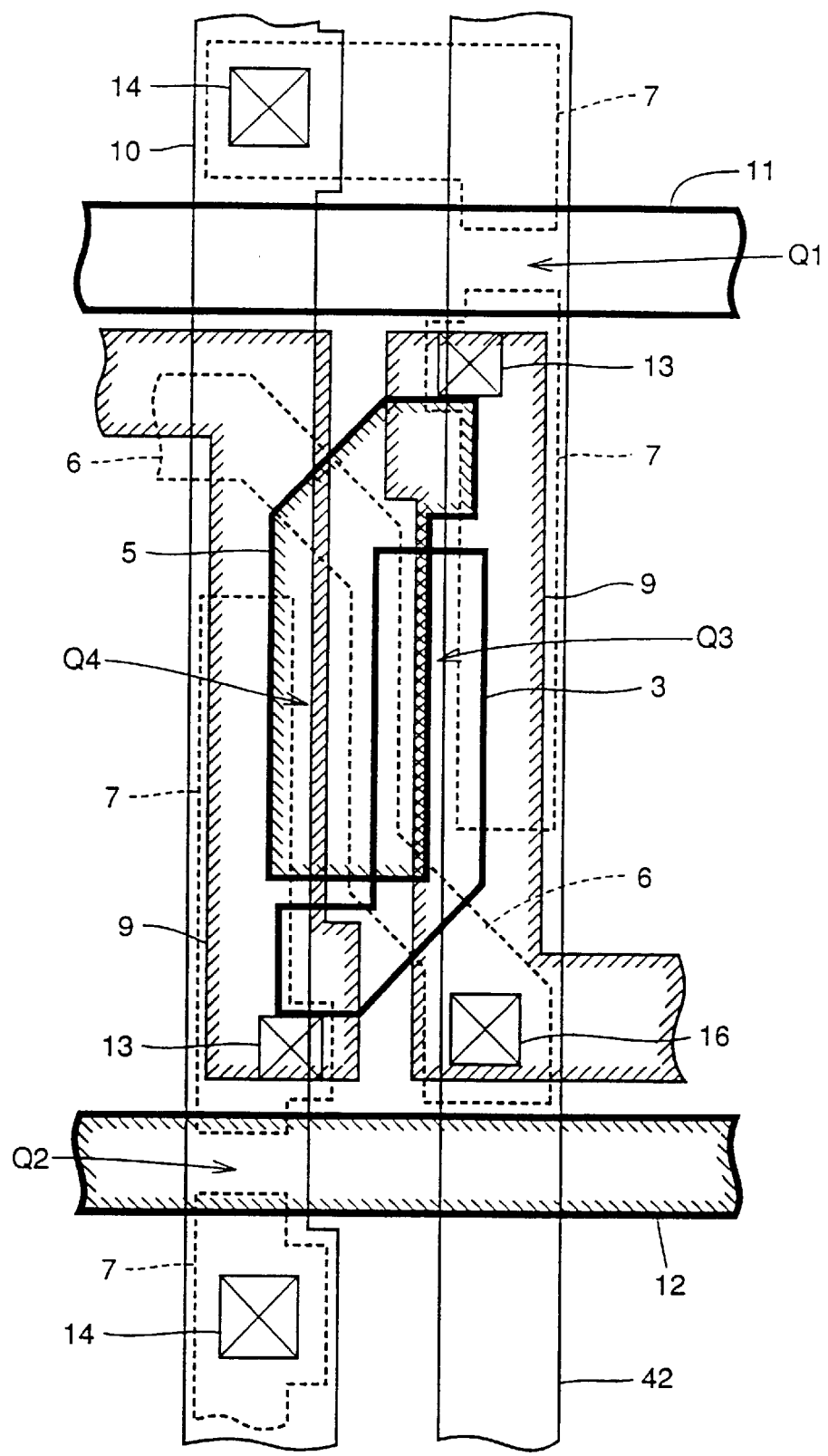
FIG. 20 is a plan view showing an arrangement of the high resistance load-type SRAM in accordance with the ninth embodiment of the present invention of which equivalent circuit is shown in FIG. 19.

FIG. 20 is a plan showing an example of an arrangement of the single bit line-type SRAM. In the present embodiment, there is one bit line 10 per one memory cell, and a conductive interconnection 42 for applying GND potential can be connected through a contact 16 to an impurity diffusion layer 6 which forms a common source region of driver transistors Q3 and Q4.

Operation of such a single bit line-type SRAM as in the present embodiment is as follows. When inputs to bit line 10 and word line 11 are at Low potential and High potential, respectively, for example, Low is latched at a contact 13 which forms a memory node. At this time, word line 12 is assumed to be Low. If word line 11 is Low and word line 12 is High, Low is latched at contact 13, which forms a memory node, on the side of word line 12. The same applies when input to bit line 10 is High. Accordingly, in the case of a single bit line, a different signal is input to each of word lines 11 and 12.

A tenth embodiment of the present invention will now be described with reference to FIG. 21. The present embodiment shows another example of a single bit line-type SRAM. In the present embodiment, one bit line 10 is formed to extend laterally in FIG. 21 and a number of bit lines is reduced by one with respect to that in the eighth embodiment shown in FIG. 18, thereby producing a margin in a pattern of an aluminum interconnection layer used for formation of the bit line.

Figure 21:
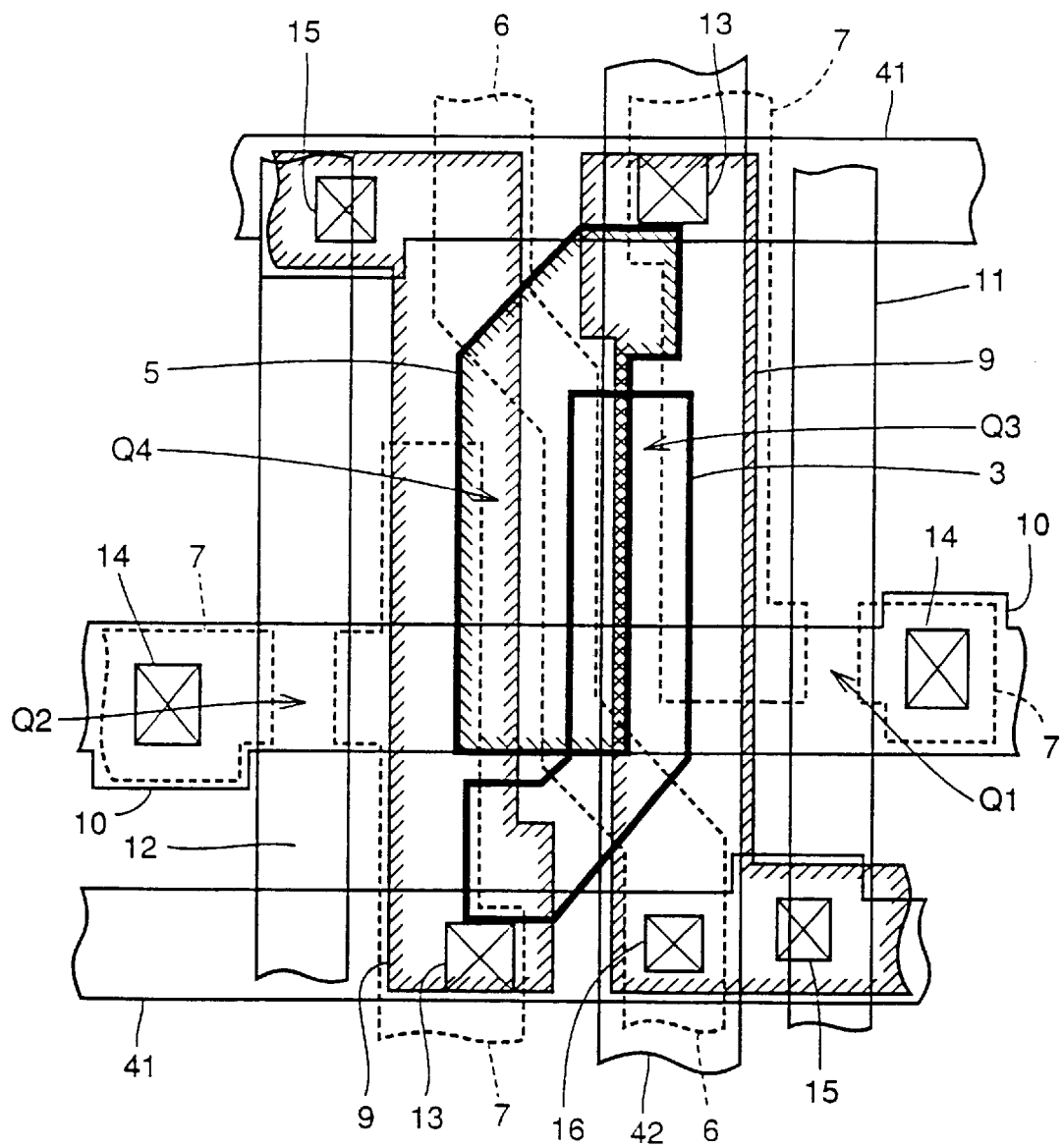
FIG. 21 is a plan view showing a high resistance load-type SRAM in accordance with a tenth embodiment of the present invention.

In the present embodiment, although a conductive interconnection 42 formed of aluminum interconnection for applying GND is placed longitudinally in FIG. 21, formation of bit line 10 and conductive interconnection 42 by patterning of the same aluminum interconnection layer can be carried out by forming conductive interconnection 42 laterally in the unused region which results from reduction by one in the number of bit lines.

Figure 22:
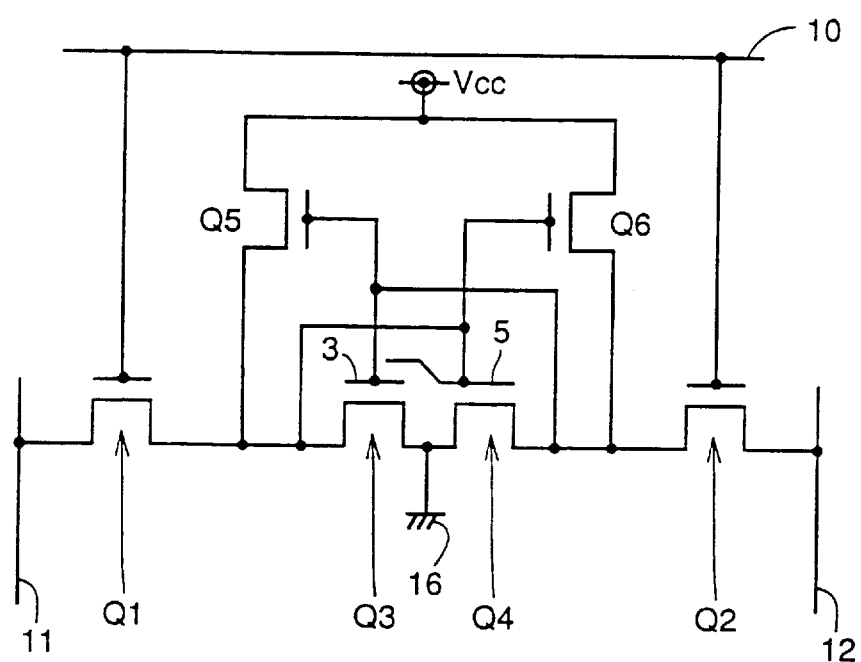
FIG. 22 is a diagram showing an equivalent circuit of a TFT-type SRAM in accordance with an eleventh embodiment of the present invention.
Figure 23:
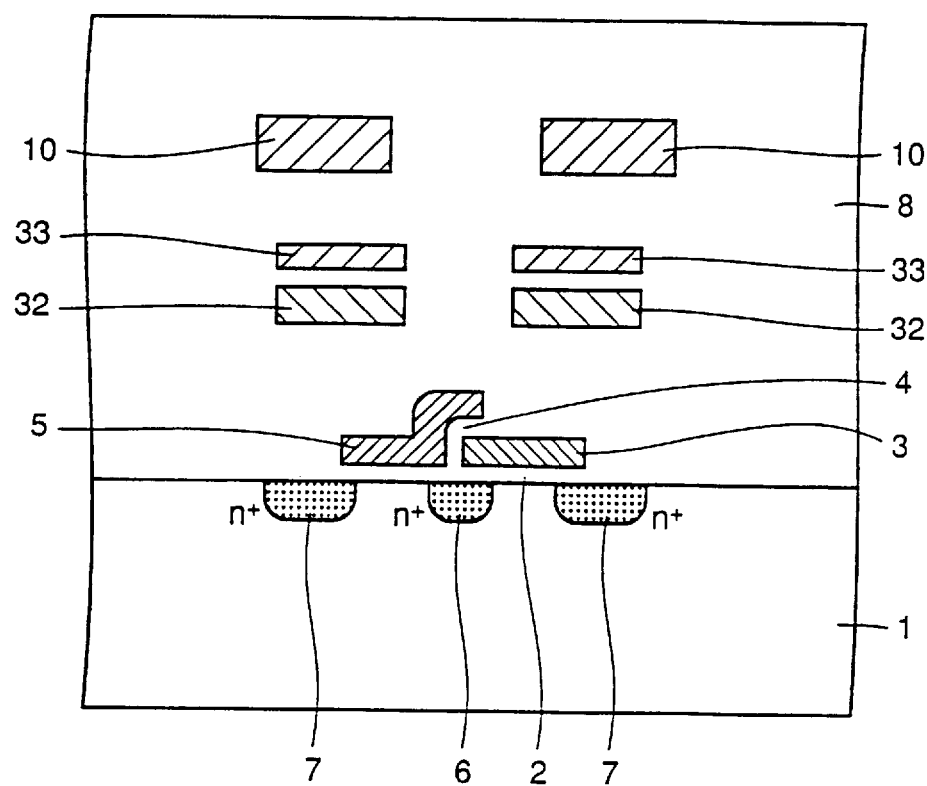
FIG. 23 is a cross section corresponding to that taken along the line II—II in FIG. 1, showing the TFT-type SRAM in accordance with the eleventh embodiment of the present invention of which equivalent circuit is shown in FIG. 22.

A structure in accordance with an eleventh embodiment of the present invention which is applied to a TFT-type SRAM and manufacturing method thereof will now be described with reference to FIGS. 22–24. FIG. 22 is a diagram showing an equivalent circuit of the TFT-type SRAM in which TFT transistors Q5 and Q6 instead of the high resistance load in the above-described first to tenth embodiments are used as a load element. Referring to FIG. 23, in the SRAM having such an equivalent circuit, gate electrodes 32 and 32 as well as channel regions 33 and 33 of TFTs are formed in approximately the same position as that of high resistance loads 9 and 9 of the first embodiment in the structure corresponding to the cross section taken along the line II—II in FIG. 1. The structure of the present embodiment is approximately the same as that of the first embodiment except for that.

Figure 24:
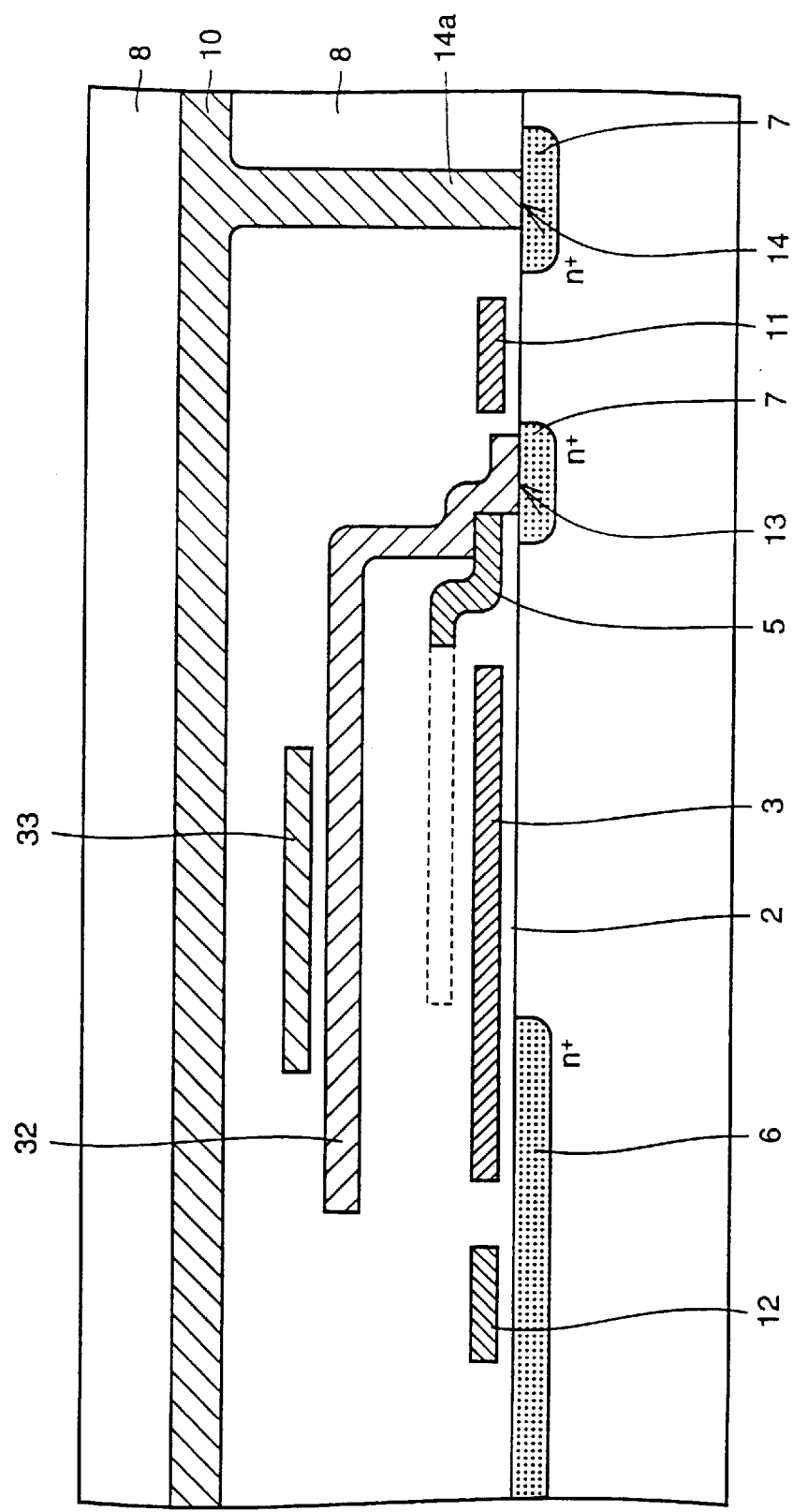
FIG. 24 is a cross section corresponding to that taken along the line III—III in FIG. 1, showing the TFT-type SRAM in accordance with the eleventh embodiment of the present invention of which equivalent circuit is shown in FIG. 22.
Figure 25A:
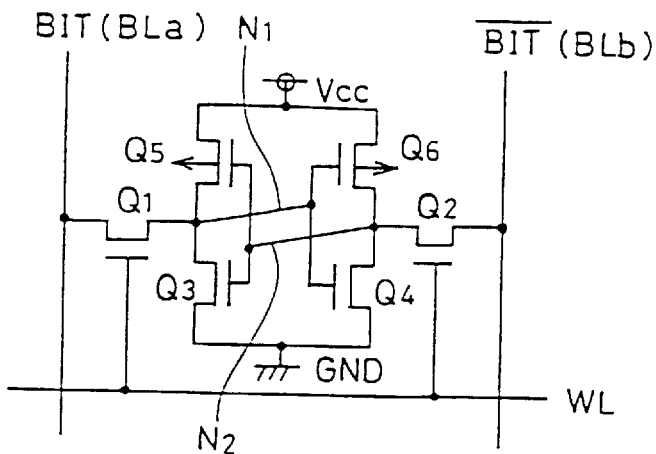
FIG. 25A is a diagram showing an equivalent circuit of a single memory cell of a conventional CMOS-type SRAM.
Figure 25B:
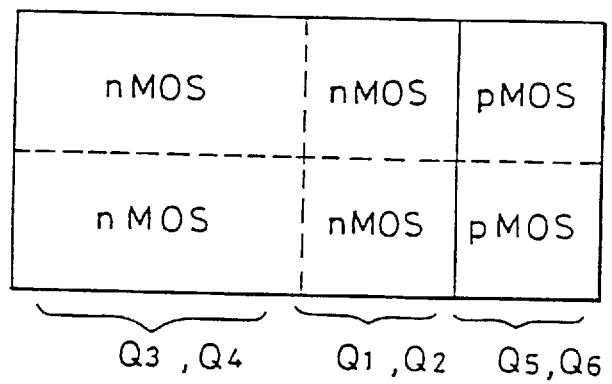
FIG. 25B is a diagram schematically showing a two-dimensional arrangement of the memory cell of the SRAM shown in FIG. 25A.
Figure 25C:
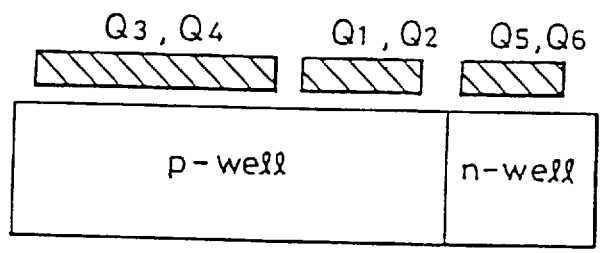
FIG. 25C is a cross section schematically showing a structure of the memory cell of the SRAM shown in FIG. 25A.
Figure 26A:
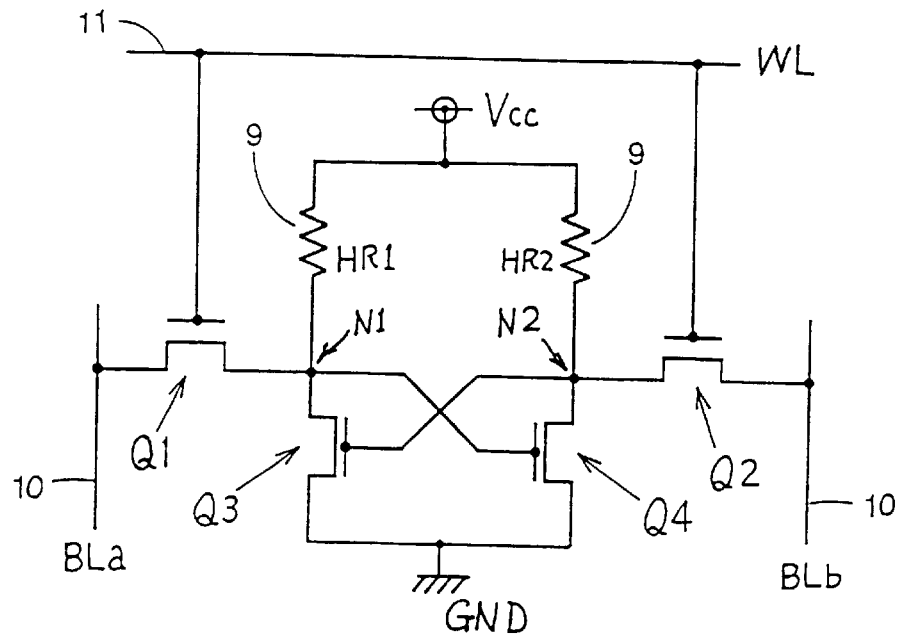
FIG. 26A is a diagram of an equivalent circuit showing a configuration of a memory cell of a conventional high resistance load-type SRAM.
Figure 26B:
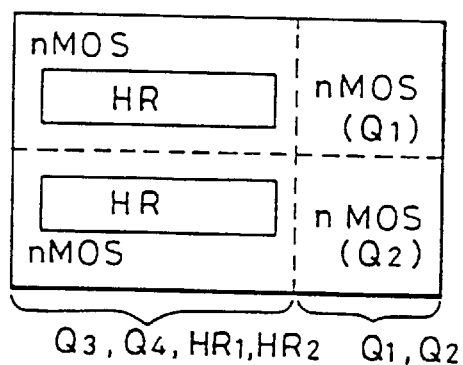
FIG. 26B is a diagram schematically showing a two-dimensional arrangement of the memory cell shown in FIG. 26A.
Figure 26C:
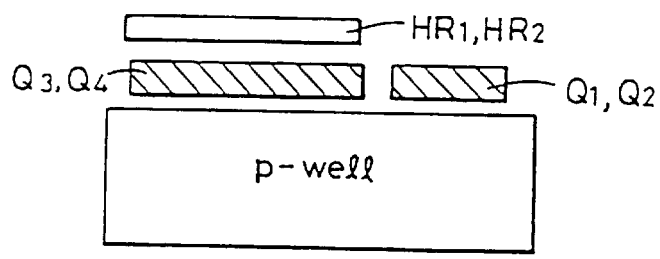
FIG. 26C is a cross section showing a structure of the memory cell shown in FIG. 26A.
Figure 27A:
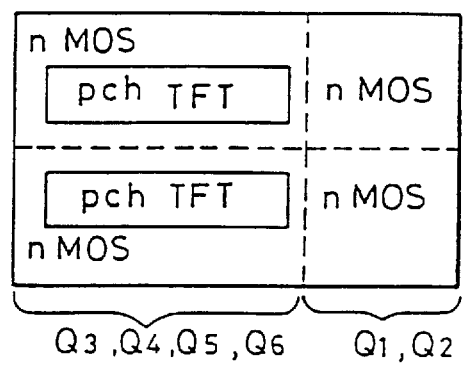
FIG. 27A is a diagram schematically showing a two-dimensional arrangement of a memory cell of a TFT-type SRAM.
Figure 27B:
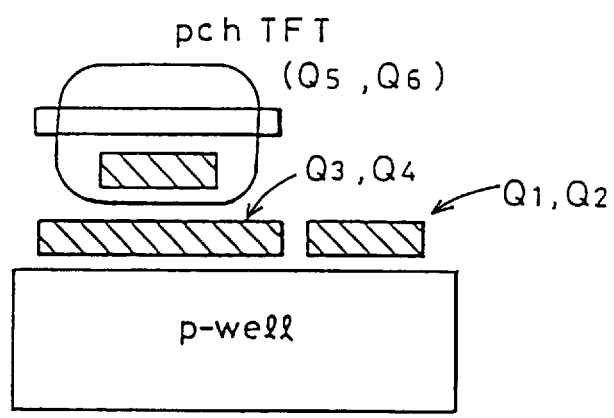
FIG. 27B is a cross section schematically showing a structure of the memory cell shown in FIG. 27A.
Figure 28:
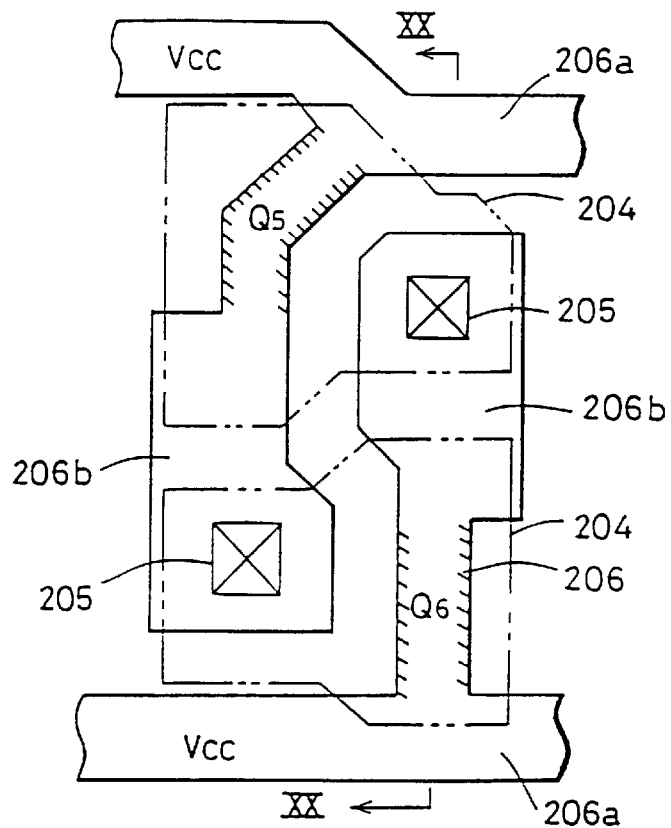
FIG. 28 is a plan view showing an arrangement of only an upper layer portion of a memory cell of a conventional TFT-type SRAM.
Figure 29:
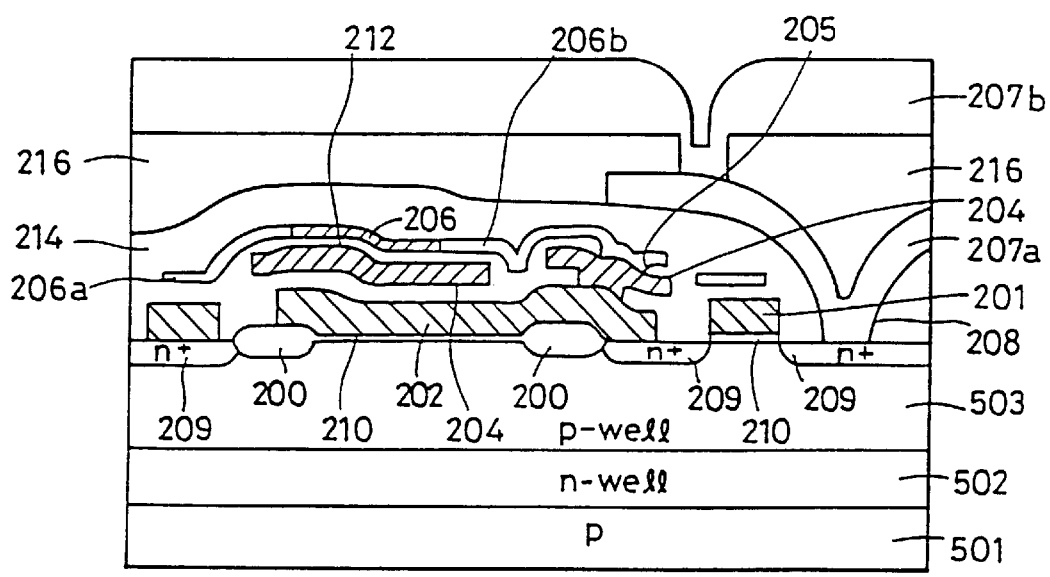
FIG. 29 is a cross section taken along the line XX—XX in FIG. 28.

FIG. 24 is a cross section which corresponds to that taken along the line III—III in FIG. 1, showing the structure of SRAM of the present embodiment. As has been described above, the concept of the present invention can be applied to the TFT-type SRAM in which a TFT is used as a load element, and area per unit memory cell can be reduced as in the case of the first to tenth embodiments, resulting in higher degree of integration of the SRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor integrated circuit device, comprising the steps of:

implanting an impurity of a second conductivity type into a prescribed region of a main surface of a semiconductor substrate of a first conductivity type to form an impurity diffusion layer of the second conductivity type;

after forming the impurity diffusion layer of the second conductivity type, forming a first conductor layer of a prescribed thickness on the main surface of said semiconductor substrate with a first insulating film therebetween;

forming a first conductor of a prescribed width by patterning said first conductor layer;

covering top and side surfaces of said first conductor with a second insulating film;

forming a second conductor layer of a prescribed thickness on said first and second insulating films; and forming a second conductor having one side on a top surface of said first conductor and another side on a region of said first insulating film where said first conductor has not been formed, wherein the impurity diffusion layer of the second conductivity type extends from the main surface under the first and second conductors with the first insulating layer therebetween.

2. The method of manufacturing a semiconductor integrated circuit device according to claim 1, further comprising the step of:

forming a conductive metal thin film on the exposed surface of said impurity diffusion layer.

3. The method of manufacturing a semiconductor integrated circuit device according to claim 1, further comprising the step of:

forming, after said step of forming said second conductor, a conductive metal thin film on a prescribed region of a surface of at least one of said first and second conductors.

4. The method of manufacturing a semiconductor integrated circuit device according to claim 3, wherein said first and second conductors are formed of impurity-doped polycrystalline silicon, and said step of forming said conductive metal thin film includes the steps of heating after formation of a metal thin film on the whole surface of said semiconductor substrate, causing a silicidation reaction between said metal thin film and said first and second conductors, and removing the metal thin film which has not reacted, thereby forming a salicide film on a top surface of said first and second conductors.

* * * * *